(12) United States Patent
Kishimoto et al.

(10) Patent No.: US 7,558,307 B2
(45) Date of Patent: Jul. 7, 2009

(54) SEMICONDUCTOR LASER DEVICE, SEMICONDUCTOR LASER DEVICE MANUFACTURING METHOD, OPTICAL DISK APPARATUS AND OPTICAL TRANSMISSION SYSTEM

(75) Inventors: Katsuhiko Kishimoto, Nara (JP); Yoshie Fujishiro, Tenri (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 439 days.

(21) Appl. No.: 11/058,618

(22) Filed: Feb. 16, 2005

(65) Prior Publication Data

US 2005/0213628 A1    Sep. 29, 2005

(30) Foreign Application Priority Data

| Feb. 16, 2004 | (JP) | ............................. P2004-038067 |
| Feb. 16, 2004 | (JP) | ............................. P2004-038071 |
| Nov. 19, 2004 | (JP) | ............................. P2004-336085 |
| Nov. 19, 2004 | (JP) | ............................. P2004-336089 |

(51) Int. Cl.
*H01S 5/00* (2006.01)

(52) U.S. Cl. ................................. 372/46.01; 372/45.01

(58) Field of Classification Search ............ 372/43.013, 372/46.01, 44.01, 45.011; 257/79; 385/37
See application file for complete search history.

(56) References Cited

U.S. PATENT DOCUMENTS

| 4,615,032 | A | * | 9/1986 | Holbrook et al. | ......... 372/45.01 |
| 4,829,357 | A | * | 5/1989 | Kasahara | ..................... 257/113 |
| 4,888,784 | A | * | 12/1989 | Hirata | ...................... 372/46.01 |
| 6,301,282 | B1 |  | 10/2001 | Capasso et al. |  |
| 2005/0013334 | A1 | * | 1/2005 | Watanabe et al. | ............. 372/44 |

FOREIGN PATENT DOCUMENTS

JP            4-111375 A            4/1992

(Continued)

OTHER PUBLICATIONS

Electronics Letters Jul. 5, 1979, vol. 15, No. 14, pp. 441-442.
Electronics Letters Nov. 20, 1986, vol. 22, No. 24, pp. 1290-1291.

*Primary Examiner*—Minsun Harvey
*Assistant Examiner*—Tuan N. Nguyen
(74) *Attorney, Agent, or Firm*—Birch, Stewart, Kolsach & Birch, LLP

(57) ABSTRACT

In a semiconductor laser device, a p-side electrode (114) of a multilayer structure put in contact with the surface of a ridge portion (130) of a second conductive type semiconductor layer group (p-AlGaAs first upper cladding layer (108), p-AlGaAs second upper cladding layer (109), p-GaAs etching stop layer (110), p-AlGaAs third upper cladding layer (111), p-GaAs contact layer (112) and p$^+$-GaAs contact layer (113)) is formed. The p-side electrode (114) has one or a plurality of high refractive index layers and low refractive index layers formed successively from the side put in contact with the surface of the semiconductor layer group of the second conductive type. The high refractive index layers have a refractive index of not lower than 2.5 with respect to the wavelength band of the emission laser light and a total thickness of not greater than 75 nm, while the low refractive index layers have a refractive index of not higher than 1.0 with respect to the wavelength band of the emission laser light.

27 Claims, 15 Drawing Sheets

FOREIGN PATENT DOCUMENTS

| | | |
|---|---|---|
| JP | 6-69111 B2 | 8/1994 |
| JP | 9-260781 A | 10/1997 |
| JP | 2000138420 A | 5/2000 |
| JP | 2001-15851 A | 1/2001 |
| JP | 2001-94195 A | 4/2001 |
| JP | 2002-353553 A | 12/2002 |

* cited by examiner

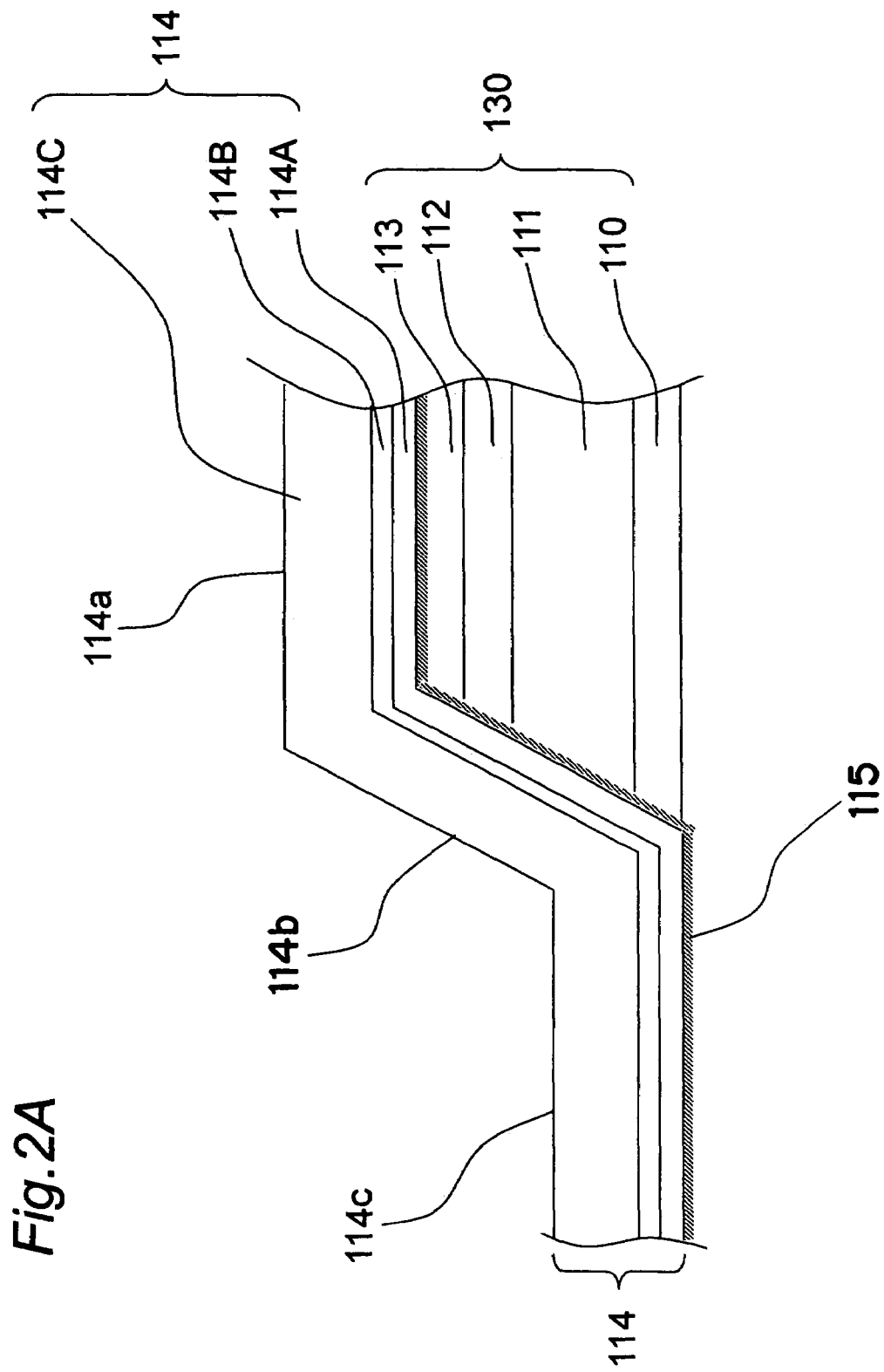

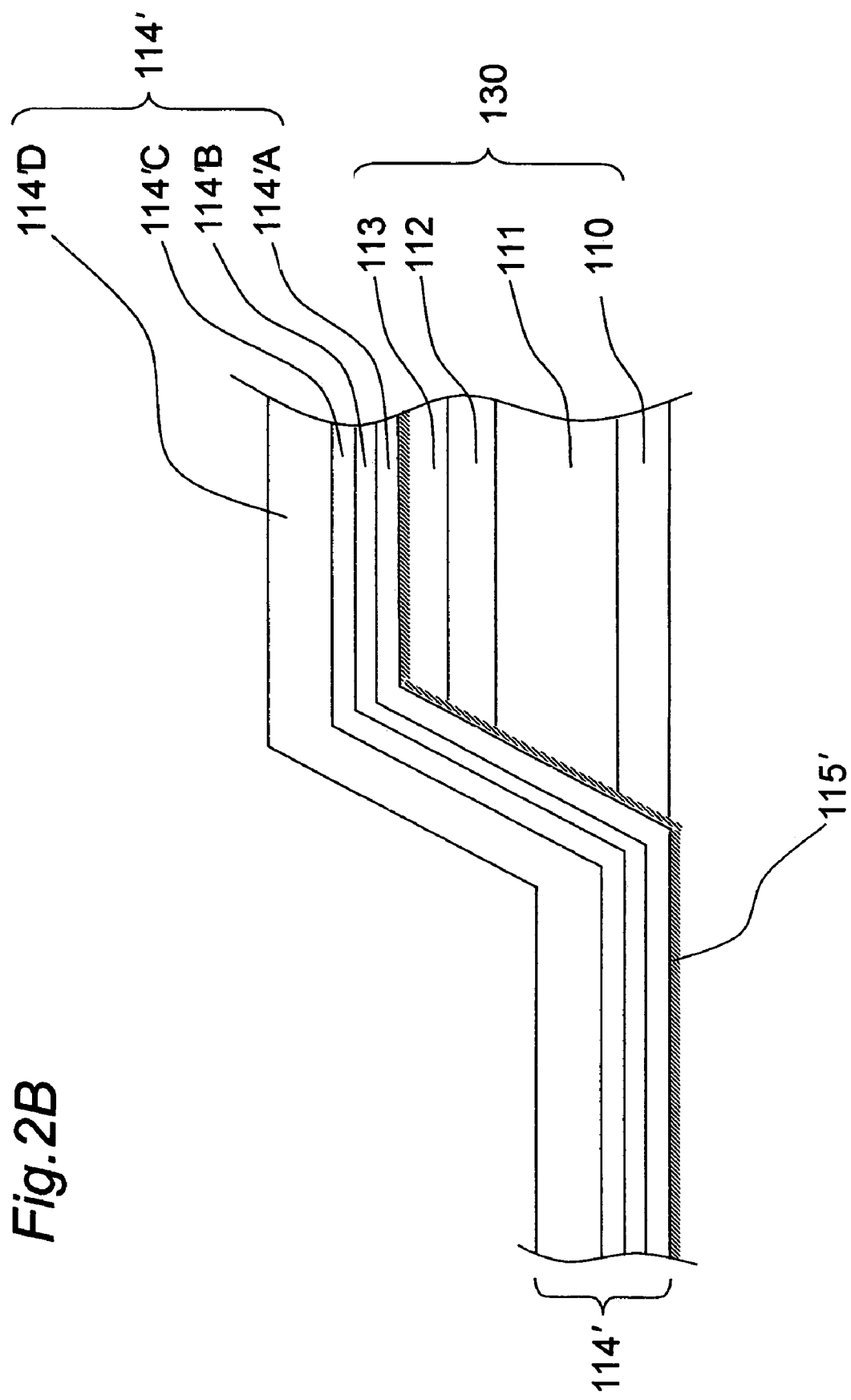

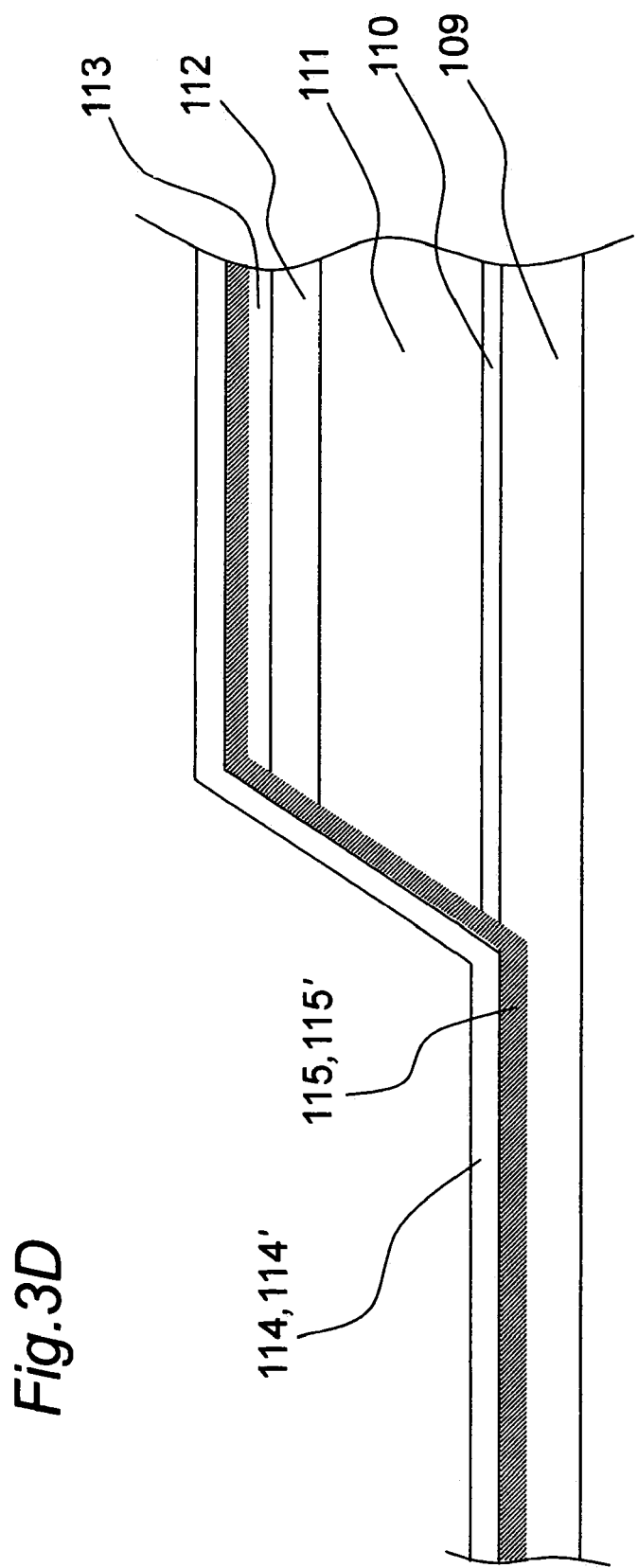

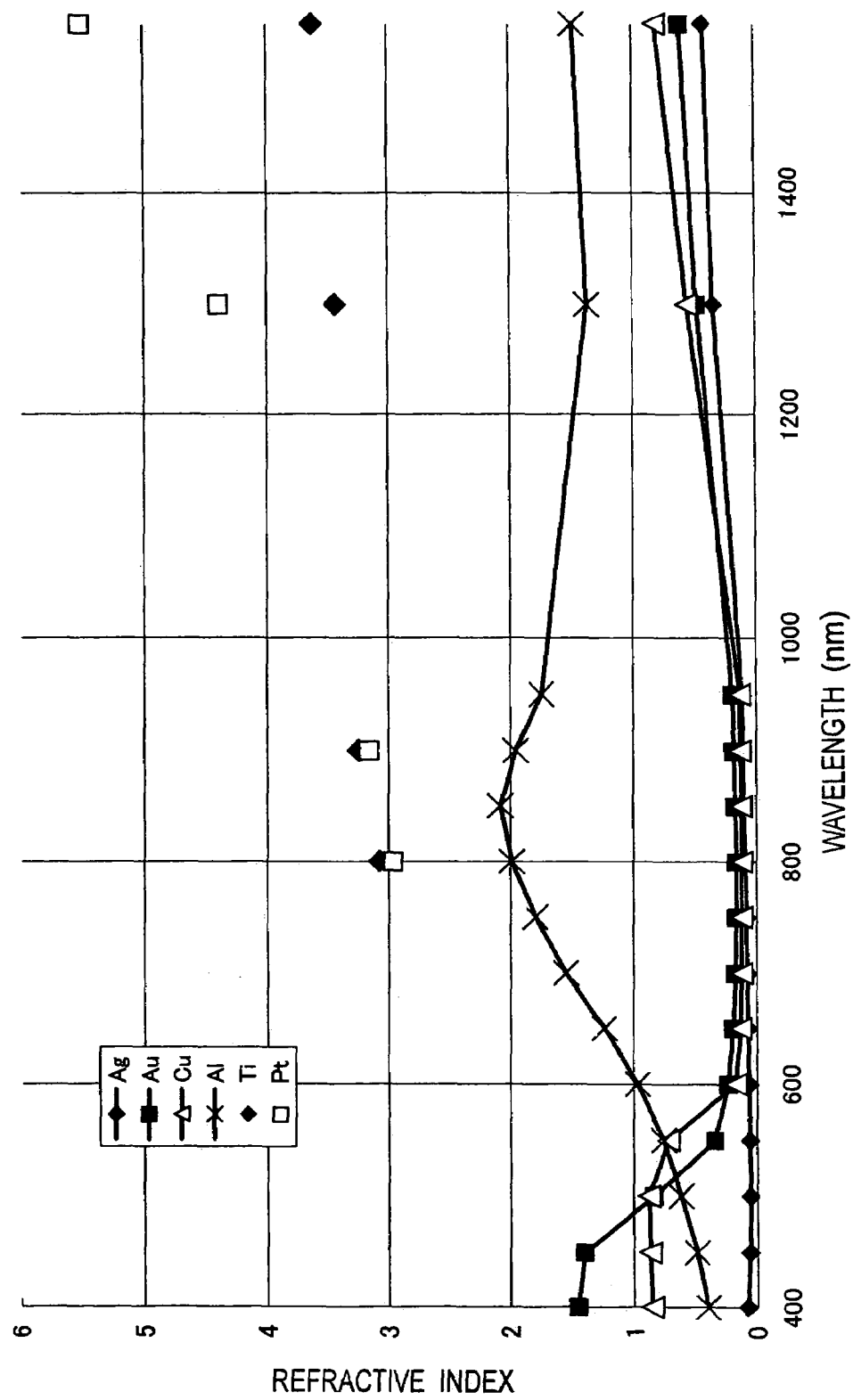

SEMICONDUCTOR LASER DEVICE, SEMICONDUCTOR LASER DEVICE MANUFACTURING METHOD, OPTICAL DISK APPARATUS AND OPTICAL TRANSMISSION SYSTEM

CROSS-REFERENCE TO RELATED APPLICATIONS

This nonprovisional application claims priorities under 35 U.S.C. §119 (a) on Patent Applications No. 2004-038067, No. 2004-038071, No. 2004-336085, and No. 2004-336089, the entire contents of which are incorporated herein by reference.

BACKGROUND OF THE INVENTION

The present invention relates to a semiconductor laser device, a semiconductor laser device manufacturing method, an optical disk apparatus and an optical transmission system and relates, in particular, to a semiconductor laser device for use in an optical disk apparatus and an optical transmission system and a manufacturing method therefor.

A ridge waveguide semiconductor laser device, which has a ridge portion on its active layer and is able to be manufactured through one-time crystal growth process, has an advantage that the semiconductor laser device can be manufactured at low cost since the manufacturing processes thereof are simpler than those of a ridge-buried semiconductor laser device that needs three-time crystal growth processes.

FIG. 7 shows a prior art example a particular one of the ridge waveguide semiconductor laser devices in which current constriction is effected by a Schottky junction manufacturable at lower cost (refer to, for example, JP 04-111375 A) in comparison with the ridge waveguide semiconductor laser device for effecting current constriction by an insulator generally known as an air ridge type.

The semiconductor laser device is manufactured as follows. First of all, as shown in FIG. 7, an n-InGaP cladding layer 402, an InGaAs/GaAs strained quantum well active layer 403, a p-InGaP cladding layer 404 and a p-InGaAs contact layer 405 are successively layered on an n-GaAs substrate 401 by the metal-organic chemical vapor deposition (MOCVD) method. Next, the p-InGaP cladding layer 404 is etched partway by the technique of photolithography or the like to form a mesa. Thereafter, the materials of Ti/Pt/Au are deposited successively from the lower layer as a p-electrode 406, and the materials of Au—Ge—Ni/Au are successively deposited as an n-electrode 407. When a current is flowed through the thus manufactured device, a Schottky junction portion 408 is formed between the p-InGaP cladding layer 404 and the p-electrode 406, and a current flows only between the p-electrode 406 and the p-InGaAs contact layer 405, effecting the current constriction.

In contrast to the manufacturing method of the ridge-buried semiconductor laser device that has needed three-time crystal growth processes, the construction of the conventional ridge waveguide semiconductor laser device can be manufactured through only one-time crystal growth process. Furthermore, since an insulator or the like is not used for current constriction, the manufacturing processes are largely simplified, and a ridge waveguide semiconductor laser device, which can be manufactured at an overwhelmingly low cost in comparison with the conventional ridge-buried semiconductor laser device, is provided.

However, the ridge waveguide semiconductor laser device has had the following problems. That is, in the ridge waveguide semiconductor laser device in which the current constriction is effected by the Schottky junction without forming an insulator as in the prior art example, the electrode is put in direct contact with the side surfaces of the ridge portion and the surface of the cladding layer extended outwardly of the ridge portion dissimilarly to the air ridge semiconductor laser device in which the current flow is prevented by providing an insulator at the interface between the electrode and the semiconductor layer. It has been discovered that the emission laser light distribution disadvantageously comes to have a configuration such that it is easy to leak toward the electrode formed on the ridge portion side surfaces and the surface of the cladding layer in the neighborhood of the ridge portion depending on the relation between the refractive index of the semiconductor material that constitutes the semiconductor laser device and the refractive index of the electrode material.

For example, with regard to the refractive indices of the electrode materials used in the conventional ridge waveguide semiconductor laser device, the refractive index of Ti brought in contact with the semiconductor material is about 3.0 to 3.6 for a laser having wavelength from 600 nm to 1.5 µm, and the refractive index of Pt provided on the upper side of Ti is 3.0 to 5.5 for a laser having wavelength from 700 nm to 1.5 µm. On the other hand, an effective refractive index in the vertical direction outside the ridge portion is also, for example, about 3.2, and the refractive index values of them are close to one another.

As described above, if the effective refractive index in the vertical direction outside the ridge portion and the refractive index of the electrode material formed directly on the semiconductor layer have the values close to each other, then light sometimes tends to easily leak in the direction toward the electrode in the conventional ridge waveguide semiconductor laser device in which the current constriction is effected by utilizing the Schottky junction.

Then, the discovered problem is that the metal material constituting the electrode became a very large absorption component of the oscillating laser light to increase the internal loss, possibly causing an increase in the oscillation threshold current of the semiconductor laser device and reducing the slope efficiency when light disadvantageously leaks to the electrode since the photoabsorption coefficient of the metal material is generally $10^4$ to $10^5$ times as high as that of the semiconductor material.

SUMMARY OF THE INVENTION

It is an object of the present invention to overcome the problems and provide a semiconductor laser device, which does not allow the increase in the internal loss by possessing a light distribution configuration such that light does not leak to the electrode side and restraining the photoabsorption in the electrode and is operable with low threshold current oscillation and high efficiency and be manufactured at low cost, and a manufacturing method therefor.

Another object of the present invention is to provide an optical disk apparatus and an optical transmission system employing the semiconductor laser device that overcomes the problems.

In order to achieve the above object, there is provided a ridge waveguide semiconductor laser device having at least an active layer and a semiconductor layer group of a second conductive type on which a ridge portion is formed on a substrate of a first conductive type, comprising:

an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion, the upper electrode having a high refractive index layer and a low refractive index layer formed successively from a side put in contact with the semiconductor layer group of the second conductive type, the high refractive index layer having a refractive index of not lower than 2.5 with respect to a wavelength band of emission laser light and a thickness of not greater than 75 nm, and the low refractive index layer having a refractive index of not higher than 1.0.

In this case, the "first conductive type" means one conductive type of the n-type and the p-type, while the "second conductive type" means the other conductive type of the n-type and the p-type.

Moreover, in this case, the "high refractive index layer" means a material layer whose refractive index in the wavelength band of the emission laser light is not lower than 2.5, while the "low refractive index layer" means a material layer whose refractive index is not higher than 1.0.

Moreover, the thickness of the high refractive index layer means the thickness of the layer itself when one high refractive index layer is formed and means the total thickness when a plurality of high refractive index layers are formed.

According to the semiconductor laser device of the construction, by virtue of the upper electrode such that the thickness of the high refractive index layer which is one of the material layers constituting the upper electrode and is provided on the side put in contact with the semiconductor layer group and has a refractive index of not lower than 2.5 is set to a thickness of not greater than 75 nm and the low refractive index layer of a refractive index of not higher than 1.0 is provided on the high refractive index layer, the distribution of the emission laser light can be prevented from having a configuration such that the light is pulled to the electrode side under the influence of the high refractive index layer that has a relatively high refractive index. As a result, photoabsorption by the upper electrode can be reduced, and an increase in the internal loss is restrained. Therefore, a semiconductor laser device that has a low oscillation threshold current and a high slope efficiency and is operable with low power consumption can be provided at low cost.

In one embodiment of the present invention, the thickness of the high refractive index layer is not greater than 15 nm.

According to the semiconductor laser device of the embodiment, the internal loss can be made at least a half or less if the thickness of the high refractive index layer is set not greater than 15 nm, and therefore, a high slope efficiency can be achieved.

In one embodiment of the present invention, the high refractive index layer functions as at least one of an adhesion improvement layer and a diffusion prevention layer.

According to the semiconductor laser device of the embodiment, the upper electrode is prevented from peeling off by possessing the adhesion improvement layer, and the manufacturing yield is improved. Moreover, the metal material that constitutes the low refractive index layer can be prevented from diffusing into the semiconductor layer by providing the diffusion prevention layer, and the problems of a reduction in efficiency due to internal scattering attributed to the diffused metal elements and a reduction in reliability can be prevented from occurring.

In this case, the "adhesion improvement layer" means a layer formed to improve the adhesion between the material layer formed on the upper side of the adhesion improvement layer and the layer (semiconductor layer in this case) that serves as the groundwork of the adhesion improvement layer, while the "diffusion prevention layer" means a layer formed to prevent the material layer formed above the diffusion prevention layer from diffusing downward beyond the diffusion prevention layer.

In one embodiment of the present invention, the adhesion improvement layer is made of at least one of titanium, chromium and molybdenum.

According to the semiconductor laser device of the embodiment, by using at least one of titanium, chromium and molybdenum for the adhesion improvement layer, the adhesion to the groundwork layer can be largely improved. In this case, titanium (Ti) or chromium (Cr) or molybdenum (Mo) has a refractive index of not lower than 2.5 with respect to light in the emission wavelength band of about 400 nm to 1.5 μm.

In one embodiment of the present invention, the diffusion prevention layer is made of at least one of platinum group elements.

In this case, the platinum group element is the generic term of ruthenium (Ru), rhodium (Rh), palladium (Pd), osmium (Os), iridium (Ir) and platinum (Pt).

According to the semiconductor laser device of the embodiment, by using at least one of the platinum group elements for the diffusion prevention layer, it becomes possible to sufficiently restrain the diffusion in the material layer formed above it. Moreover, by using the platinum group element, a material of a refractive index of not lower than 2.5 with respect to light in the emission wavelength band of about 500 nm to 1.5 μm can be obtained.

By forming the high refractive index layer to a thickness of not greater than 15 nm, a configuration such that light does not leak on the upper electrode side can be provided, and the photoabsorption by the upper electrode can be reduced to a half or less than in the conventional case. Therefore, a semiconductor laser device, which has a low threshold current and a highly efficient oscillation characteristic and in which the increase in the internal loss is restrained, can be provided.

In one embodiment of the present invention, the upper electrode comprises at least a first material layer that is the high refractive index layer and functions as the adhesion improvement layer, a second material layer that is the high refractive index layer and functions as the diffusion prevention layer and a third material layer that is the low refractive index layer of a refractive index of not higher than 1.0, the layers being formed successively from a side of the semiconductor layer group of the second conductive type.

According to the construction of the semiconductor laser device of the embodiment, by employing the high refractive index layer that has a function to improve adhesion as the first material layer, the adhesion of the upper electrode to the semiconductor layer can be improved, allowing the manufacturing yield to be improved and allowing the defect of electrode peel off at the time of wire bonding to be also reduced. Moreover, by employing the high refractive index layer that has the function of the diffusion prevention layer as the second material layer, the element that constitutes the third material layer formed above the upper layer of the second material layer can be prevented from diffusing toward the semiconductor layer beyond the second material layer. The reliability of the semiconductor laser device is improved, and the problems of scattering and absorption of the emission laser light caused by the electrode material element diffused in the semiconductor layer disappear, improving the internal quantum efficiency. With this arrangement, a semiconductor laser device that concurrently has a high slope efficiency and reliability can be provided.

In one embodiment of the present invention, the first material layer has a thickness of not smaller than 1 nm and not greater than 25 nm, the second material layer has a thickness of not smaller than 5 nm and not greater than 50 nm, and a total thickness of the first material layer and the second material layer is not greater than 75 nm.

According to the construction of the semiconductor laser device of the embodiment, the first material layer has the effect of improving the adhesion of the upper electrode if the thickness of the first material layer is at least not smaller than 1 nm. Moreover, it is sufficient for the first material layer to have a thickness of not greater than 25 nm since the layer has no effect of further improving the adhesion even if formed to a thickness exceeding 25 nm. The second material layer formed to prevent the third material layer from diffusing can obtain a sufficient effect when the thickness is at least not smaller than 5 nm, and the diffusion prevention effect is increased as the thickness is greater. However, the upper limit should preferably be 50 nm compromising with the absorption loss of light. Moreover, if the total thickness of the first material layer and the second material layer is not greater than 75 nm, then the photoabsorption by the upper electrode is to be reduced, and a semiconductor laser device, of which the internal loss is restrained, is obtained.

In one embodiment of the present invention, a compound layer, which is comprised of at least one constituent element of titanium, chromium, molybdenum and a platinum group element and a constituent element of the semiconductor layer group of the second conductive type, is formed at an interface between the first material layer of the upper electrode and the semiconductor layer group of the second conductive type.

According to the construction of the semiconductor laser device of the embodiment, by providing the compound layer, which constitutes at least one constituent element of titanium, chromium, molybdenum and a platinum group element and the constituent element of the semiconductor layer group of the second conductive type, at the interface between the upper electrode and the semiconductor layer, the adhesion of the upper electrode is further improved. Moreover, there is the effect of preventing the element that constitutes the upper electrode from diffusing more deeply into the semiconductor layer beyond the compound layer. In addition, there is an effect that the electrical connection between the upper electrode and the semiconductor layer is further reinforced.

In one embodiment of the present invention, an ohmic junction is formed of the upper electrode and an uppermost portion of the ridge portion, and a Schottky junction is formed of the upper electrode and at least one of the side surface of the ridge portion and a surface of the semiconductor layer group of the second conductive type in a region located in the neighborhood of the ridge portion except for the ridge portion.

According to the construction of the semiconductor laser device of the embodiment, the device can be manufactured through one-time crystal growth process in comparison with the ridge-buried semiconductor laser device, and it is not required to provide an insulator in the region other than the ridge portion for the current constriction to the ridge portion. Therefore, the manufacturing processes are largely simplified. As a result, a ridge waveguide semiconductor laser device, which is operable with a low threshold current and high efficiency and manufacturable at low cost, is provided.

In one embodiment of the present invention, the semiconductor layer group of the second conductive type has a heavily doped semiconductor layer that is provided in an uppermost portion of the ridge portion and has a doping concentration of not lower than $1 \times 10^{18}$ cm$^{-3}$ and a lightly doped semiconductor layer that is provided at least in a region other than the uppermost portion of the ridge portion and has a doping concentration of not higher than $1 \times 10^{17}$ cm$^{-3}$, a compound layer on a heavily doped side comprised of a constituent element of the upper electrode and a constituent element of the heavily doped semiconductor layer is formed at an interface between the upper electrode and the heavily doped semiconductor layer, and a compound layer on a lightly doped side comprised of a constituent element of the upper electrode and a constituent element of the lightly doped semiconductor layer is formed at an interface between the upper electrode and the lightly doped semiconductor layer.

According to the semiconductor laser device of the construction, in the structure in which the heavily doped semiconductor layer is provided in the uppermost portion of the ridge portion and the lightly doped semiconductor layer is provided at least in the region other than the uppermost portion of the ridge portion, a lower contact resistance is obtained by the compound layer on the heavily doped semiconductor side at the ohmic junction between the heavily doped semiconductor layer that is located in the uppermost portion of the ridge portion and has a doping concentration of not lower than $1 \times 10^{18}$ cm$^{-3}$ and the upper electrode, while sufficient current constriction is obtained by the compound layer on the lightly doped semiconductor side at the Schottky junction between the lightly doped semiconductor layer that is located in the region other than the uppermost portion of the ridge portion and has a doping concentration of not higher than $1 \times 10^{17}$ cm$^{-3}$ and the upper electrode. As described above, both the ohmic junction and the Schottky junction are reinforced, and therefore, sufficient current constriction and a low contact resistance can be achieved without separately carrying out the crystal regrowth process of the embedded layer (current blocking layer) for effecting the current constriction and the crystal regrowth process of the contact layer for obtaining a low contact resistance, and thermal and electrical reliabilities are improved. Furthermore, the Schottky junction portion for effecting the current constriction and the ohmic junction portion for effecting the current injection can be concurrently formed by the identical upper electrode formed on the heavily doped semiconductor layer and the lightly doped semiconductor layer of the semiconductor layer group of the second conductive type, and therefore, the manufacturing cost can be largely reduced. Therefore, a semiconductor laser device, which has low power consumption because of the enabled low threshold current and high efficiency operation and is allowed to have reduced cost by simplifying the manufacturing processes, can be provided.

In one embodiment of the present invention, at least a semiconductor layer of the second conductive type having a doping concentration of not lower than $1 \times 10^{17}$ cm$^{-3}$ is formed between the lightly doped semiconductor layer and the active layer.

According to the semiconductor laser device of the embodiment, by further forming at least the semiconductor layer of the second conductive type having a doping concentration of not lower than $1 \times 10^{17}$ cm$^{-3}$ between the lightly doped semiconductor layer and the active layer, the layer thickness, composition and so on of the semiconductor layer of the second conductive type can be freely changed according to the required optical characteristic specification without limitations on achieving a satisfactory Schottky junction characteristic. Therefore, the degree of freedom of the optical design is increased, and an increase in the device resistance can be restrained, so that a further reduction in the power consumption can be achieved.

Also, there is provided a semiconductor laser device manufacturing method comprising the steps of:

forming an active layer on a substrate of the first conductive type;

forming a semiconductor layer group of the second conductive type on the active layer;

forming a ridge portion by partially removing the semiconductor layer group of the second conductive type; and forming an upper electrode on the semiconductor layer group of the second conductive type, whereby in the step of forming the upper electrode, one or a plurality of high refractive index layers of a refractive index of not lower than 2.5 with respect to a wavelength band of emission laser light are formed so as to have a total thickness of not greater than 75 nm and a low refractive index layer of a refractive index of not higher than 1.0 is formed on the high refractive index layer.

According to the semiconductor laser device manufacturing method of the present invention, by setting the total thickness of the high refractive index layers of a refractive index of not lower than 2.5 with respect to laser light in the emission wavelength band of the semiconductor laser device to a thickness of not greater than 75 nm and forming the low refractive index layer of a refractive index of not higher than 1.0 on the high refractive index layer, the distribution of the emission laser light can be prevented from having a configuration such that the light is pulled to the electrode side under the influence of the high refractive index layer having a relatively high refractive index. Consequently, the photoabsorption by the upper electrode can be reduced, and an increase in the internal loss is restrained.

In one embodiment of the present invention, the step of forming the upper electrode comprises the step of forming a first material layer that is made of at least one of titanium, chromium and molybdenum and functions as an adhesion improvement layer and the step of forming a second material layer that is made of at least one of platinum group elements and functions as a diffusion prevention layer as high refractive index layers, and the step of forming a third material layer of a low refractive index layer of a refractive index of not higher than 1.0.

According to the semiconductor laser device manufacturing method of the embodiment, the first material layer that functions as the adhesion improvement layer and the second material layer that functions as the diffusion prevention layer have a refractive index of not lower than 2.5 and are formed so that the total thickness thereof becomes equal to or smaller than 75 nm. Therefore, the distribution of the emission laser light can be prevented from having a configuration such that the light is pulled to the electrode side, and the photoabsorption by the upper electrode can be reduced. Therefore, the manufacturing method of the semiconductor laser device, which is operable with low threshold current oscillation and a high efficiency by restraining an increase in the internal loss, is provided.

In one embodiment of the present invention, the step of forming the semiconductor layer group of the second conductive type on the active layer comprises at least the step of forming a lightly doped semiconductor layer of a doping concentration of not higher than $1 \times 10^{17}$ cm$^{-3}$ and a heavily doped semiconductor layer of a doping concentration of not lower than $1 \times 10^{18}$ cm$^{-3}$ on the active layer, and the method comprises the step of forming a compound layer at an interface between the semiconductor layer group of the second conductive type and the upper electrode by carrying out heat treatment after the step of forming the upper electrode.

According to the semiconductor laser device manufacturing method of the embodiment, sufficient current constriction is obtained by the compound layer at the Schottky junction between the lightly doped semiconductor layer of a doping concentration of not higher than $1 \times 10^{17}$ cm$^{-3}$ and the upper electrode, while a low contact resistance is obtained by the compound layer at the ohmic junction between the heavily doped semiconductor layer of a doping concentration of not lower than $1 \times 10^{18}$ cm$^{-3}$ and the upper electrode. As described above, the Schottky junction property and the ohmic junction property are reinforced. Therefore, low power consumption operation becomes possible with a low threshold current and a high efficiency without carrying out the embedding regrowth process of the current blocking layer and the crystal regrowth process of the electrode contact layer, and the manufacturing processes can be simplified to allow the cost reduction to be achieved. Therefore, it becomes possible to manufacture a semiconductor laser device, which obtains a sufficient current constriction property and an excellent device characteristic and is operable with low power consumption.

In one embodiment of the present invention, the step of forming the semiconductor layer of the second conductive type comprises at least the step of forming a semiconductor layer of the second conductive type that has a doping concentration of not lower than $1 \times 10^{17}$ cm$^{-3}$ between the lightly doped semiconductor layer and the active layer.

According to the semiconductor laser device manufacturing method of the embodiment, by further forming the semiconductor layer of the second conductive type of a doping concentration of at least not lower than $1 \times 10^{17}$ cm$^{-3}$ between the lightly doped semiconductor layer and the active layer, a semiconductor laser device manufacturing method, of which the degree of freedom of the optical design for making it possible to freely change the layer thickness, composition and so on of the semiconductor layer of the second conductive type according to the required optical characteristic specification is increased without limitations on achieving a satisfactory Schottky junction characteristic and by which a further reduction in the power consumption is achieved by restraining an increase in the device resistance, can be provided.

Also, there is provided an optical disk apparatus employing the above semiconductor laser device.

According to the optical disk apparatus, it is possible to provide an optical disk apparatus operable with low power consumption less expensively than in the conventional optical disk apparatus.

Also, there is provided an optical transmission system employing the above semiconductor laser device.

According to the optical transmission system, it is possible to provide an optical transmission module operable with low power consumption less expensively than in the conventional case, and cost reduction of the optical transmission system can be achieved.

In order to achieve the above object, there is also provided a ridge waveguide semiconductor laser device which has at least an active layer and a semiconductor layer group of the second conductive type on a substrate of the first conductive type and in which part of an upper portion of the semiconductor layer group of the second conductive type forms a ridge portion of a stripe configuration, comprising:

an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion, the upper electrode having at least a lowermost layer of a refractive index of not higher than 1.0 with respect to emission laser light.

In this case, the "first conductive type" means one conductive type of the n-type and the p-type, while the "second conductive type" means the other conductive type of the n-type and the p-type.

According to the semiconductor laser device of the construction, the material used for at least the lowermost layer of the upper electrode has a sufficiently low refractive index of not higher than 1.0, and therefore, the oscillating laser light can be confined in the semiconductor layer scarcely leaking on the upper electrode side. With this arrangement, the electrode material does not become a photoabsorption component, and therefore, a semiconductor laser device, which has a low oscillation threshold current and a high slope efficiency and is operable with low power consumption without increasing the internal loss, can be provided.

In one embodiment of the present invention, the lowermost layer of the upper electrode, whose refractive index with respect to the emission laser light is not higher than 1.0, has a film thickness of not smaller than 30 nm.

According to the construction of the semiconductor laser device of the embodiment, by setting the layer thickness of the lowermost layer of the upper electrode of which the refractive index is not higher than 1.0 to a thickness of not smaller than 30 nm, the influence of the refractive index of the other upper electrode materials formed on the upper side of the lowermost layer of the upper electrode is scarcely received. Therefore, the construction of the upper electrode of the multilayer structure can be optimized so as to improve the reliability of the upper electrode and reduce the resistance value while maintaining the characteristics of the low threshold current and highly efficient oscillation without increasing the internal loss. With this arrangement, a further improvement in the device characteristics can be achieved.

In one embodiment of the present invention, the lowermost layer of the upper electrode is made of at least one of Au, Ag, Cu and Al.

According to the construction of the semiconductor laser device of the embodiment, by using Ag or Cu for the lowermost layer of the upper electrode, the refractive index can be made not greater than one when the wavelength of the emission laser light is within a range of at least not smaller than 400 nm to an excess of 1.5 μm. Moreover, when Au is used for the lowermost layer of the upper electrode, the refractive index can be made not greater than one when the emission wavelength is within a range of not smaller than 500 nm to an excess of 1.5 μm. Moreover, by using Al for the lowermost layer of the upper electrode, the refractive index can be made not greater than one when the wavelength of the emission laser light is within a range of at least not smaller than 400 nm and not greater than 650 nm. Moreover, the lowermost layer of the upper electrode may be made of an alloy including the metals.

In one embodiment of the present invention, three layers of at least an adhesion improvement layer, a diffusion prevention layer and a low-resistance layer are successively layered on the lowermost layer of the upper electrode.

In this case, the "adhesion improvement layer" means the layer provided for improving the adhesion of the layers formed on the layer (adhesion improvement layer) with respect to the groundwork of the layer (adhesion improvement layer), while the "diffusion prevention layer" means the layer provided for preventing the material that constitutes the layers provided above the layer (diffusion prevention layer) from diffusing to the lower side of the layer (diffusion prevention layer) beyond the layer (diffusion prevention layer). Moreover, the "low-resistance layer" is the layer provided for the purpose of reducing the wiring resistance and the contact resistance to the metal wires and so on used for electrical connection to the outside.

According to the construction of the semiconductor laser device of the embodiment, the adhesion improvement layer for improving the adhesion to the lowermost layer of the upper electrode, the diffusion prevention layer provided for preventing the low-resistance layer from diffusing to the lowermost layer side and the low-resistance layer are formed on the lower side of the upper electrode. With this arrangement, the low-resistance upper electrode, which has satisfactory adhesion to the lowermost layer and is prevented from diffusing to the lowermost layer, can be obtained. As a result, the electrode construction, in which the lowermost layer of a refractive index of not higher than 1.0 can stably keep existing even in long-term device operation while keeping the resistance of the upper electrode low, is provided.

In one embodiment of the present invention, an ohmic junction is formed of the upper electrode and an uppermost portion of the ridge portion of the semiconductor layer group of the second conductive type, and a Schottky junction is formed of the upper electrode and at least part of a region other than the uppermost portion of the ridge portion.

According to the semiconductor laser device of the embodiment, the device can be manufactured through the one-time crystal growth process and needs no insulator or the like to be provided in the region other than the ridge portion for the current constriction to the ridge portion in comparison with the ridge-buried semiconductor laser device that needs the three-time crystal growth processes. Therefore, the manufacturing processes are largely simplified. As a result, a ridge waveguide semiconductor laser device, which is operable with low threshold current and a high efficiency and is manufacturable at low cost, is provided.

In one embodiment of the present invention, the uppermost portion of the ridge portion of the semiconductor layer group of the second conductive type is a heavily doped semiconductor layer of the second conductive type of a doping concentration of not lower than $1\times10^{18}$ cm$^{-3}$, at least part of the region other than the uppermost portion of the ridge portion of the semiconductor layer group of the second conductive type is a lightly doped semiconductor layer of the second conductive type of a doping concentration of not higher than $1\times10^{17}$ cm$^{-3}$, a compound layer on a heavily doped side comprised of a constituent element of the upper electrode and a constituent element of the heavily doped semiconductor layer is formed at an interface between the upper electrode and the heavily doped semiconductor layer, and a compound layer on a lightly doped side comprised of a material of the upper electrode and a constituent element of the lightly doped semiconductor layer is formed at an interface between the upper electrode and the lightly doped semiconductor layer.

According to the semiconductor laser device of the construction, a lower contact resistance is obtained by the compound layer on the heavily doped semiconductor side at the ohmic junction between the heavily doped semiconductor layer of a doping concentration of not lower than $1\times10^{18}$ cm$^{-3}$ and the upper electrode, while sufficient current constriction is obtained by the compound layer on the lightly doped semiconductor side at the Schottky junction between the lightly doped semiconductor layer of a doping concentration of not higher than $1\times10^{17}$ cm$^{-3}$ and the upper electrode. As described above, both the ohmic junction and the Schottky junction are reinforced, and therefore, sufficient current constriction and a low contact resistance can be achieved without separately carrying out the crystal regrowth process of the embedded layer (current blocking layer) for effecting the current constriction and the crystal regrowth process of the contact layer for obtaining a low contact resistance, and the thermal and electrical reliabilities are improved. Therefore, a semiconductor laser device, which has low power consumption because of the enabled low threshold current and high efficiency operation and excellent reliability and is allowed to be reduced in cost by simplifying the manufacturing processes, can be provided.

Moreover, the heavily doped semiconductor layer is provided in the uppermost portion of the ridge portion, and the lightly doped semiconductor layer is provided at least in the region other than the uppermost portion of the ridge portion. With this arrangement, in the ridge portion where the heavily doped semiconductor layer is provided in the uppermost portion and the lightly doped semiconductor layer is provided in the region other than the uppermost portion, the Schottky junction portion for effecting current constriction and the ohmic junction portion for effecting current injection can be concurrently formed by the identical upper electrode formed on the heavily doped semiconductor layer and the lightly doped semiconductor layer of the semiconductor layer group of the second conductive type. Therefore, a semiconductor laser device capable of largely reducing the manufacturing cost can be provided.

In one embodiment of the present invention, at least a semiconductor layer of the second conductive type having a doping concentration of not lower than $1\times10^{17}$ cm$^{-3}$ is formed between the lightly doped semiconductor layer and the active layer.

According to the semiconductor laser device of the embodiment, by further forming at least the semiconductor layer of the second conductive type of a doping concentration of not lower than $1\times10^{17}$ cm$^{-3}$ between the lightly doped semiconductor layer and the active layer, the layer thickness, composition and so on of the semiconductor layer of the second conductive type can be freely changed according to the required optical characteristic specification without limitations on achieving a satisfactory Schottky junction characteristic. Therefore, the degree of freedom of the optical design is increased, and an increase in the device resistance can be restrained, so that a further reduction in the power consumption can be achieved.

Also, there is provided a semiconductor laser device manufacturing method comprising the steps of:

forming an active layer on a substrate of the first conductive type;

forming a semiconductor layer group of the second conductive type on the active layer;

forming a ridge portion by removing part of the semiconductor layer group of the second conductive type; and forming an upper electrode by using a metal material whose refractive index with respect to emission laser light is not higher than 1.0 for a lowermost layer on the semiconductor layer group of the second conductive type.

According to the semiconductor laser device manufacturing method, the metal material of a refractive index of not higher than 1.0 with respect to the emission laser light is employed as the lowermost layer of the upper electrode, and a semiconductor laser device manufacturing method, the semiconductor laser device, which has no problem of photoabsorption in the upper electrode on the ridge portion side surfaces and in the neighborhood of the ridge portion and of which the power consumption is reduced by the enabled low threshold current oscillation and high efficiency operation, is provided.

In one embodiment of the present invention, the step of forming the semiconductor layer group of the second conductive type has the step of forming a heavily doped semiconductor layer of a doping concentration of not lower than $1\times10^{18}$ cm$^{-3}$ as an uppermost portion of the ridge portion and forming a lightly doped semiconductor layer of a doping concentration of not higher than $1\times10^{17}$ cm$^{-3}$ at least in a region other than the ridge portion, and the method comprises the step of forming a compound layer at an interface between the semiconductor layer group of the second conductive type and the upper electrode by carrying out heat treatment after the step of forming the upper electrode.

According to the semiconductor laser device manufacturing method of the embodiment, sufficient current constriction is obtained by the compound layer at the Schottky junction between the lightly doped semiconductor layer of a doping concentration of not higher than $1\times10^{17}$ cm$^{-3}$ and the upper electrode, while a lower contact resistance is obtained by the compound layer at the ohmic junction between the heavily doped semiconductor layer of a doping concentration of not lower than $1\times10^{18}$ cm$^{-3}$ and the upper electrode. As described above, both the ohmic junction and the Schottky junction are reinforced. Therefore, low power consumption operation becomes possible with a low threshold current and a high efficiency without carrying out the embedding regrowth process of the current blocking layer and the crystal regrowth process of the electrode contact layer, and the cost can be reduced by simplifying the manufacturing processes. Therefore, it becomes possible to manufacture a semiconductor laser device, which obtains a sufficient current constriction property and an excellent device characteristic and is operable with low power consumption.

In one embodiment of the present invention, the step of forming the semiconductor layer group of the second conductive type comprises the step of forming at least a semiconductor layer of the second conductive type that has a doping concentration of not lower than $1\times10^{17}$ cm$^{-3}$ between the lightly doped semiconductor layer and the active layer.

According to the semiconductor laser device manufacturing method of the embodiment, by further forming at least the semiconductor layer of the second conductive type of a doping concentration of not lower than $1\times10^{17}$ cm$^{-3}$ between the lightly doped semiconductor layer and the active layer, a semiconductor laser device manufacturing method, the semiconductor laser device, of which the degree of freedom of the optical design for making it possible to freely change the layer thickness, composition and so on of the semiconductor layer of the second conductive type according to the required optical characteristic specification is increased without limitations on achieving a satisfactory Schottky junction characteristic and by which a further reduction in the power consumption is achieved by restraining an increase in the device resistance, can be provided.

Also, there is provided an optical disk apparatus employing the above semiconductor laser device.

According to the optical disk apparatus, it is possible to provide an optical disk apparatus operable with low power consumption less expensively than in the conventional optical disk apparatus.

Also, there is provided An optical transmission system employing the above semiconductor laser device.

According to the optical transmission system, it is possible to provide an optical transmission module operable with low power consumption less expensively than in the conventional case, and cost reduction of the optical transmission system can be achieved.

As is apparent from the above, according to the semiconductor laser device of the present invention, it is possible to provide a semiconductor laser device, which is operable with low power consumption and able to increase the oscillation efficiency and reduce the oscillation threshold current since the increase in the internal loss due to the leak of light to the electrode provided on the ridge portion side can be restrained.

Moreover, according to the semiconductor laser device manufacturing method of the present invention, it is possible to provide a method capable of manufacturing a semiconductor laser device operable with low oscillation threshold current and high efficiency at low cost.

Moreover, according to the optical disk apparatus of the present invention, it is possible to provide an optical disk apparatus operable with low power consumption less expensively than in the conventional optical disk apparatus by employing the semiconductor laser device of the present invention.

According to the optical transmission system of the present invention, it is possible to provide an optical transmission module operable with lower power consumption at lower cost than in the conventional case by employing the semiconductor laser device of the present invention, and cost reduction of the optical transmission system can be achieved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2A is a schematic view for explaining an upper electrode of the semiconductor laser device of the first embodiment;

FIG. 2B is an enlarged schematic view of a p-side electrode located in the neighborhood of a ridge portion of the semiconductor laser device of the second embodiment;

FIG. 3D is a schematic sectional view for explaining a manufacturing process of the semiconductor laser device, continued from FIG. 3C;

FIG. 3F is a graph showing the refractive index of a metal material with respect to wavelength;

DETAILED DESCRIPTION OF THE PREFERRED EMBODIMENTS

Figure 1:
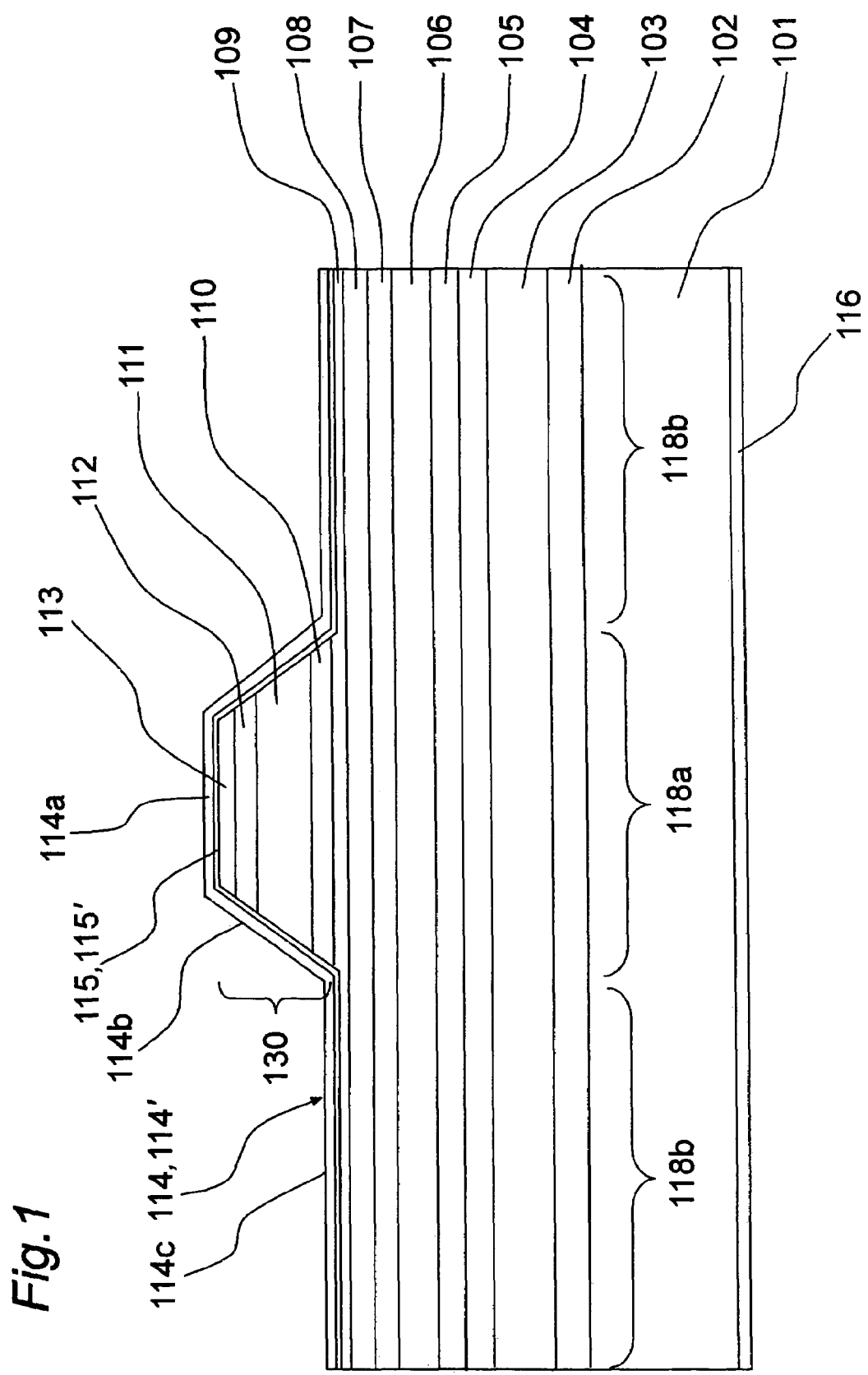
FIG. 1 is a schematic sectional view of a semiconductor laser device according to first and second embodiments of the present invention.

The semiconductor laser device, the semiconductor laser device manufacturing method, the optical disk apparatus and the optical transmission system of the present invention will be described in detail below on the basis of the embodiments shown in the drawings.

The First Embodiment

FIG. 1 shows the structure of the semiconductor laser device of the first embodiment of the present invention. In the first embodiment, the first conductive type is the n-type, and the second conductive type is the p-type.

As shown in FIG. 1, in the semiconductor laser device, an n-GaAs buffer layer 102, an n-$Al_{0.453}Ga_{0.547}As$ first lower cladding layer 103, an n-$Al_{0.5}Ga_{0.5}As$ second lower cladding layer 104, an $Al_{0.4278}Ga_{0.5722}As$ lower guide layer 105, a multiple strained quantum well active layer 106, an $Al_{0.4278}Ga_{0.5722}As$ upper guide layer 107, a p-$Al_{0.4885}Ga_{0.5115}As$ first upper cladding layer 108 as one example of the semiconductor layer of the second conductive type, and a p-$Al_{0.4885}Ga_{0.5115}As$ second upper cladding layer 109 as one example of the lightly doped semiconductor layer are successively layered on an n-GaAs substrate 101. A p-GaAs etching stop layer 110, a p-$Al_{0.4885}Ga_{0.5115}As$ third upper cladding layer 111, a p-GaAs contact layer 112 and a $p^{+}$-GaAs contact layer 113 as one example of the heavily doped semiconductor layer are provided so as to form a forward mesa striped-shaped ridge portion 130 on the second upper cladding layer 109. Further, a p-side electrode 114, which is constructed of a multilayer metal thin film formed by successively layering Ti/Pt/Au as one example of the upper electrode, is provided in a style such that the top portion and the side surface portions of the ridge portion 130 and the upper surface of the second upper cladding layer 109 (portion corresponding to the sides of the ridge portion 130 except for the portion right under the ridge portion 130) are continuously covered.

FIG. 2A is an enlarged schematic view of the periphery of the ridge portion 130 and the upper electrode (p-side electrode 114). As shown in FIG. 2A, Ti and Pt are high refractive index layers in the p-side electrode 114, where Ti is a first material layer 114A that functions as an adhesion improvement layer, Pt is a second material layer 114B that functions as a diffusion prevention layer, and Au is a third material layer 114C of a low refractive index layer. It is to be noted that reference numerals 114a, 114b and 114c denote portions (properly referred to as an "electrode portion") that covers the top portion and the side surface portions of the ridge portion 130 and the upper surface of the second upper cladding layer 109, respectively. A contact resistance between the electrode portion 114a and the top portion (contact layer 113) of the ridge portion 130 has a sufficiently low value. On the other hand, an interface formed between the electrode portion 114c and the second upper cladding layer 109 has a function to block a current downward in FIG. 1. In the p-side electrode 114, the layer that is made of Ti put in contact with the semiconductor is referred to as the lowermost layer of the upper electrode. Further, a compound layer 115, in which Ti of the lowermost layer of the upper electrode and each semiconductor layer material are alloyed, is formed at the interface between the p-side electrode 114 and each semiconductor layer put in contact with the electrode. Moreover, a multilayer metal thin film of AuGe/Ni/Au is formed as an n-side electrode 116 on the back surface of the substrate 101.

The p-AlGaAs first upper cladding layer 108, the p-AlGaAs second upper cladding layer 109, the p-GaAs etching stop layer 110, the p-AlGaAs third upper cladding layer 111, the p-GaAs contact layer 112 and the p$^+$-GaAs contact layer 113 constitute a semiconductor layer group of the second conductive type.

Next, the manufacturing method of the semiconductor laser device will be described with reference to FIGS. 3A through 3D.

Figure 3A:
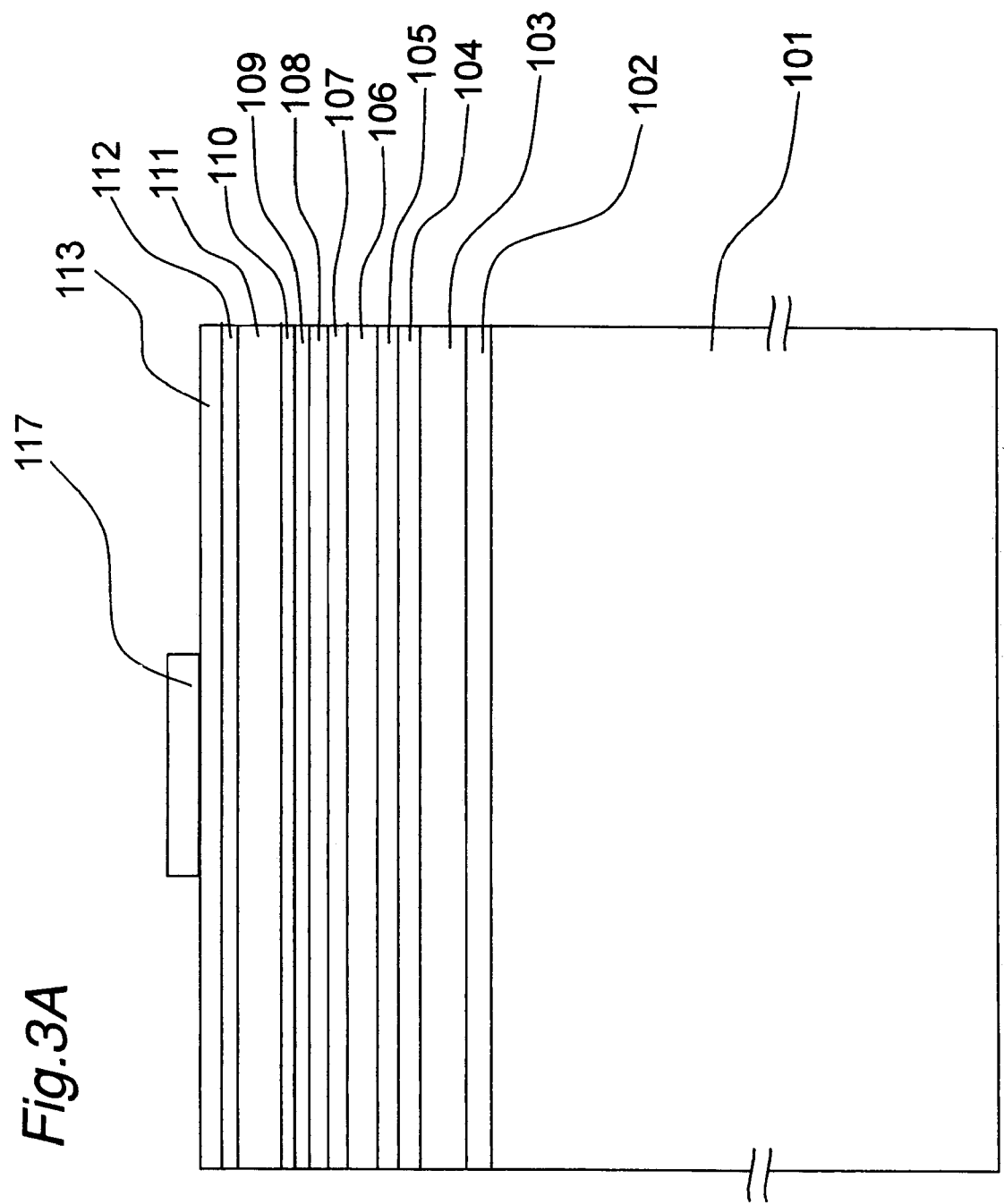
FIG. 3A is a schematic sectional view for explaining a manufacturing process of the above semiconductor laser device.

First of all, as shown in FIG. 3A, the n-GaAs buffer layer 102 (layer thickness: 0.5 μm, Si doping concentration: $8\times10^{17}$ cm$^{-3}$), the n-Al$_{0.453}$Ga$_{0.547}$As first lower cladding layer 103 (layer thickness: 3.0 μm, Si doping concentration: $5\times10^{17}$ cm$^{-3}$), the n-Al$_{0.5}$Ga$_{0.5}$As second lower cladding layer 104 (layer thickness: 0.24 μm, Si doping concentration: $5\times10^{17}$ cm$^{-3}$), the Al$_{0.4278}$Ga$_{0.5722}$As lower guide layer 105 (layer thickness: 0.1 μm), the multiple strained quantum well active layer 106, the Al$_{0.4278}$Ga$_{0.5722}$As upper guide layer 107 (layer thickness: 0.1 μm), the p-Al$_{0.4885}$Ga$_{0.5115}$As first upper cladding layer 108 (layer thickness: 0.2 μm, C doping concentration: $1\times10^{18}$ cm$^{-3}$), the p-Al$_{0.4885}$Ga$_{0.5115}$As second upper cladding layer 109 (layer thickness: 0.1 μm, C doping concentration: $1\times10^{17}$ cm$^{-3}$), the p-GaAs etching stop layer 110 (layer thickness: 3 nm, C doping concentration: $2\times10^{18}$ cm$^{-3}$), the p-Al$_{0.4885}$Ga$_{0.5115}$As third upper cladding layer 111 (layer thickness: 1.28 μm, C doping concentration: $2.7\times10^{18}$ cm$^{-3}$), the p-GaAs contact layer 112 (layer thickness: 0.2 μm, C doping concentration: $3.3\times10^{18}$ cm$^3$) and the p$^+$-GaAs contact layer 113 (layer thickness: 0.3 μm, C doping concentration: $1\times10^{20}$ cm$^{-3}$) are successively crystallinically grown on the n-GaAs substrate 101 that has a (100) surface by the MOCVD method. In the multiple strained quantum well active layer 106, In$_{0.2655}$Ga$_{0.7345}$As$_{0.5914}$P$_{0.4086}$ compressive strained quantum well layers (distortion: 0.47%, layer thickness: 5 nm, two layers) and In$_{0.126}$Ga$_{0.874}$As$_{0.4071}$P$_{0.5929}$ barrier layers (distortion: −1.2%, three layers of a layer thickness of 9 nm, 5 nm and 9 nm from the substrate side, the layer located nearest to the substrate serves as an n-side barrier layer and the layer located farthest from the substrate serves as a p-side barrier layer) are alternately arranged.

Next, in FIG. 3A, a resist mask 117 (mask width: 3.5 μm) is fabricated by a photolithography process in a region 118a (see FIG. 1) where a mesa stripe portion to be formed that becomes the ridge portion 130 (shown in FIG. 1). The resist mask 117 is formed so as to extend in a stripe shape in the <0-11> direction in correspondence with the stripe direction in which the ridge portion 130 to be formed extends.

Figure 3B:
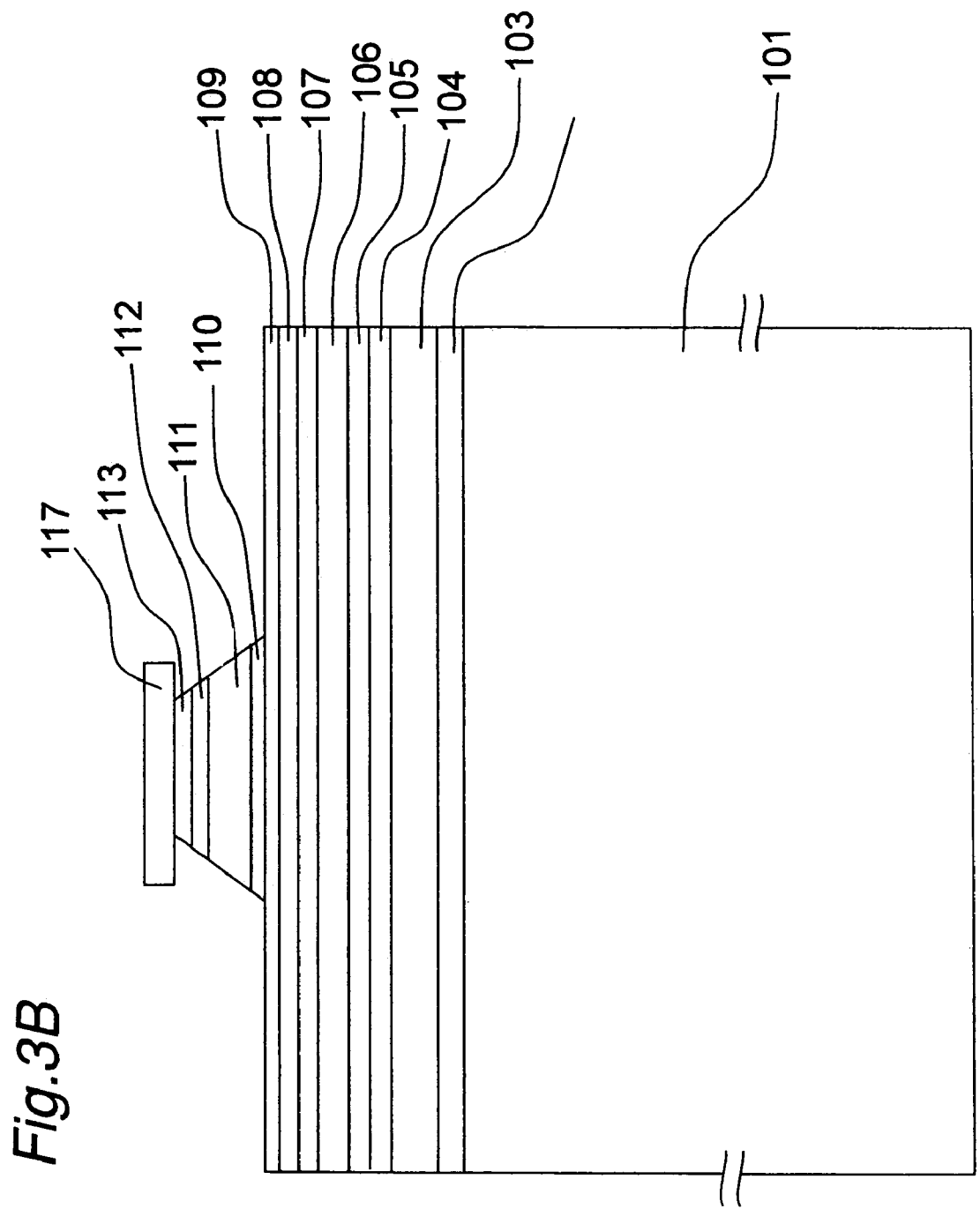
FIG. 3B is a schematic sectional view for explaining a manufacturing process of the semiconductor laser device, continued from FIG. 3A.
Figure 3C:
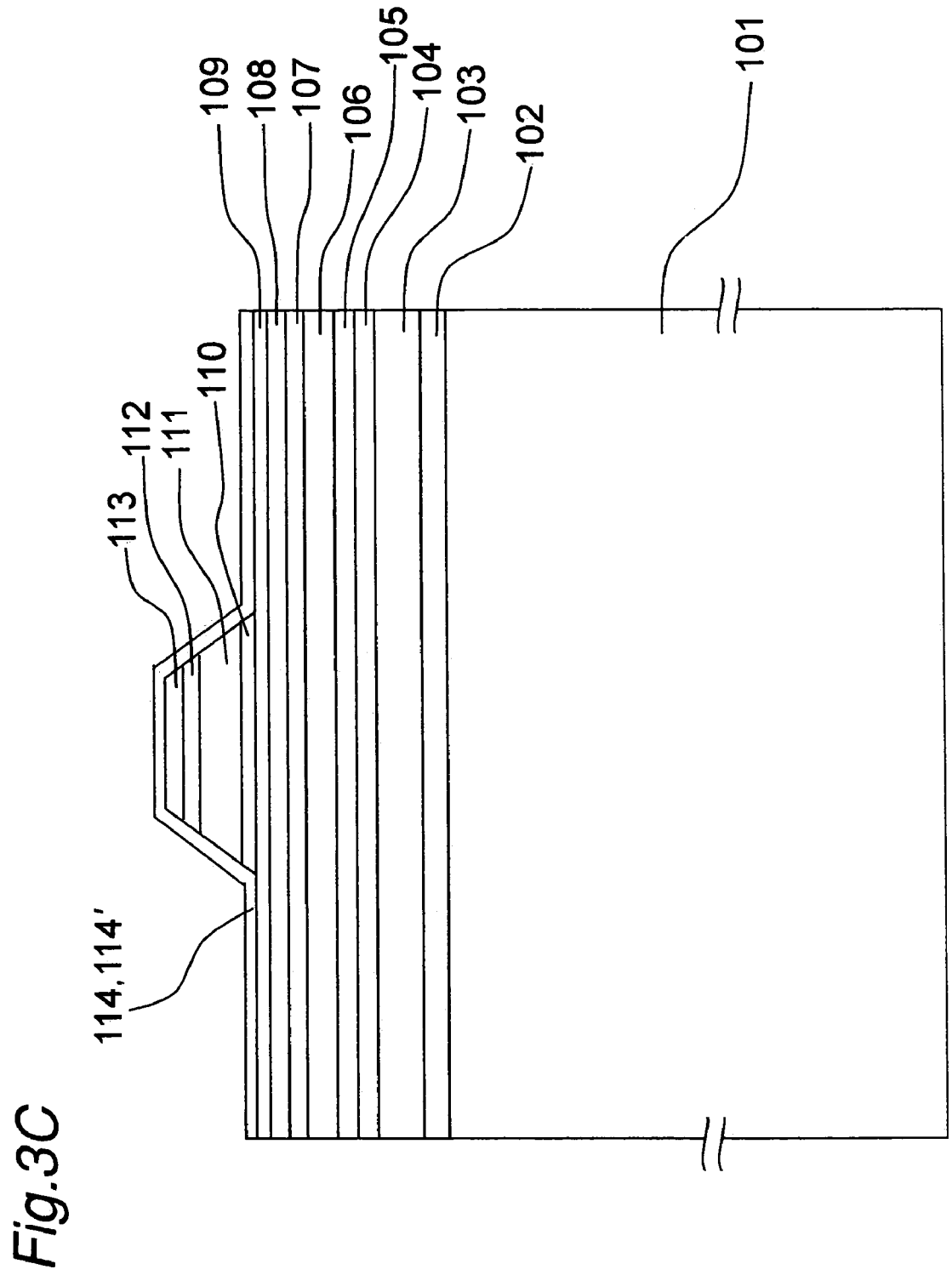
FIG. 3C is a schematic sectional view for explaining a manufacturing process of the semiconductor laser device, continued from FIG. 3B.

Next, portions 118b (see FIG. 1) of the semiconductor layers 113, 112, 111 and 110 corresponding to the sides of the resist mask 117 are removed by etching (etching process) as shown in FIGS. 3B through 3D.

In concrete, first of all, as shown in FIG. 3B, etching is effected by a wet etching method to remove a portion from the upper surface side of the p$^+$-GaAs contact layer 113 to a portion just above the p-GaAs etching stop layer 110 in the depthwise direction. In the present example, the etching was effected in two steps by using a mixture aqueous solution of sulfuric acid and a hydrogen peroxide aqueous solution and hydrofluoric acid. Taking advantage of the fact that the etching rate of GaAs is very slow when hydrofluoric acid is used, it is enabled to flatten the etched surface and control the width of the mesa stripe. Subsequently, overhanging portions of the GaAs contact layers 112 and 113 are removed while removing the p-GaAs etching stop layer 110 with a mixture aqueous solution of ammonia and a hydrogen peroxide aqueous solution. In this case, the etching depth is 1.78 μm, and the width of the lowermost portion of the forward mesa stripe is about 3.2 μm. After the etching, the resist mask 117 is removed.

Subsequently, as shown in FIG. 3C, the metal thin film constructed of Ti (thickness: 5 nm) which is the adhesion improvement layer and serves as the first material layer 114A (shown in FIG. 2A), Pt (thickness: 10 nm) which is the diffusion prevention layer and serves as the second material layer 114B (shown in FIG. 2A) and Au (thickness: 400 nm) which is the low refractive index layer and serves as the third material layer 114C (shown in FIG. 2A) in the upper electrode (p-side electrode 114) are successively layered by the electron beam (EB) evaporation method, forming the p-side electrode 114 (upper electrode).

Subsequently, the substrate 101 is abraded from the back surface side to the desired thickness (about 100 μm in this case) by the lapping method, and an n-side electrode 116 (shown in FIG. 1) is formed by layering an AuGe alloy (Au: 88%, Ge: 12%) to a thickness of 100 nm and subsequently layering Ni (thickness: 15 nm) and Au (thickness: 300 nm) from the back surface side by using the thermal evaporation method.

Subsequently, as shown in FIG. 3D, an alloying process for the p-side electrode 114 and the n-side electrode 116 is carried out by heating at a temperature of 390° C. for one minute in an N$_2$ or H$_2$ atmosphere. As a result, the compound layer 115, in which Ti and each semiconductor layer material are alloyed, is formed at the interface between the p-side electrode 114 and each semiconductor layer put in contact with the p-side electrode 114.

Subsequently, by dividing the substrate 101 into bars of the desired resonator length (800 μm in this case), then carrying out end surface coating (not shown) and further dividing each bar into chips (800 μm×250 μm), the semiconductor laser device of the first embodiment of the present invention is completed.

Although the semiconductor laser device for an optical disk apparatus of the 780-nm emission wavelength band is taken as an example according to the description of the first embodiment, it is a matter of course that the present invention is not limited to this but applicable to a semiconductor laser device for another use.

In the semiconductor laser device of the first embodiment, the first material layer 114A (Ti) as the adhesion improvement layer and the second material layer 114B (Pt) as the diffusion prevention layer, which constitute the upper electrode (p-side electrode 114), have refractive indices of about 3.08 and 2.96, respectively, with respect to light of the emission wavelength of 780 nm.

On the other hand, in the semiconductor laser device of the first embodiment, the effective refractive index in the vertical direction outside the ridge portion 130 is 3.354. The value is very general in the structure of the semiconductor laser device of the kind and normally about 3.0 to 3.5. Therefore, if the refractive indices of the first material layer 114A formed on the semiconductor layer side and the second material layer 114B of the upper electrode (p-side electrode 114) become about three as described above, then the distribution of the oscillating laser light becomes unable to ignore the influence of the refractive index of the upper electrode and tends to leak on the upper electrode side. Conventionally, when an electrode configuration constructed of Ti/Pt/Au has been used, it has been general to form each of Ti and Pt to a film thickness of not smaller than 50 nm, or a total thickness of not smaller than 100 nm. However, in the present first embodiment, by setting the total thickness of the first material layer 114A and the second material layer 114B, which have a refractive index of not lower than 2.5, to a thickness of not greater than 15 nm, the influences of the first material layer 114A and the second material layer 114B, which have relatively high refractive indices, become reduced, allowing the photoabsorption by the upper electrode to be made not greater than a half of the conventional one. Therefore, it becomes possible to restrain an increase in the internal loss.

Therefore, according to the semiconductor laser device of the first embodiment and the manufacturing method therefor, a semiconductor laser device, which has a low oscillation threshold current and a high slope efficiency and is operable with low power consumption, can be provided at low cost.

Figure 3E:
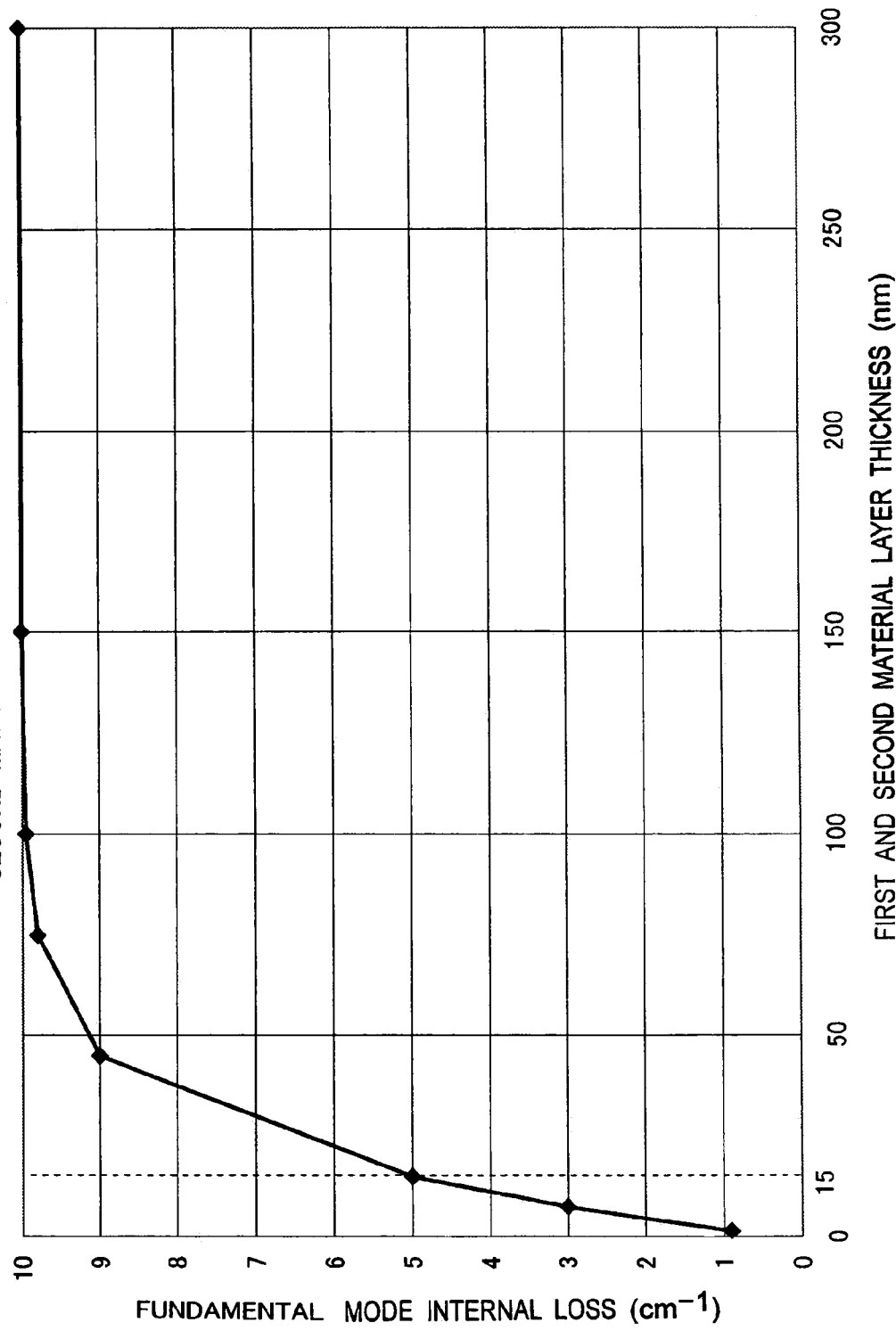
FIG. 3E is a graph showing the relation of fundamental mode internal loss with respect to the total thickness of a first material layer and a second material layer.

FIG. 3E shows the result of calculating the internal loss in the fundamental mode when the total thickness of the first material layer (Ti) and the second material layer (Pt) as the high refractive index layer in the upper electrode (p-side electrode 114) of the first embodiment of the present invention is changed. As is apparent from FIG. 3E, the internal loss is reduced in the portion where the total thickness of the first material layer and the second material layer becomes equal to or lower than 75 nm. Further, it can be understood that the internal loss in the fundamental mode is largely reduced to about a half of or less than in the conventional case when the thickness becomes equal to or lower than 15 nm. As described above, the internal loss can be reduced further than in the conventional case by setting the thickness of the high refractive index layer of the upper electrode to 75 nm or less when a material that has a refractive index of not lower than about 2.5 is served as the upper electrode in contact with the semiconductor layer, and it is possible to make the internal loss to a half of or less by setting the thickness to 15 nm or less.

The first material layer 114A made to function as the adhesion improvement layer should preferably be provided by titanium, chromium or molybdenum. These materials can easily be formed by the EB evaporation method or the like and has a great effect of improving the adhesion of the upper electrode (p-side electrode 114) material of the second material layer 114B and the succeeding layers. With this arrangement, the manufacturing yield is improved, and the defect of electrode peeloff at the time of wire bonding can also be restrained.

Moreover, the second material layer 114B made to function as the diffusion prevention layer should preferably be provided by a platinum group element. The materials can easily be formed by the EB evaporation method or the like and also becomes a satisfactory diffusion prevention layer with respect to gold, silver, copper or the like used for the third material layer. Among the platinum group elements, rhodium, of which the refractive index sometimes becomes equal to or lower than 2.5 depending on the wavelength, is preferable for the second material layer since the refractive index should rather be low compromising with the effective refractive index of the semiconductor layer. However, there is a disadvantage that rhodium is very expensive in the existing circumstances.

In this case, the third material layer, which is the low refractive index layer of a refractive index of not higher than 1.0, should preferably exist on the second material layer. Moreover, it is also important that the third material layer has a low resistance. Although the influence of the third material layer is increased when the first material layer and the second material layer are reduced in thickness, it is possible to prevent the light distribution of the emission laser light from leaking on the upper electrode (p-side electrode 114) side by forming a material layer of a refractive index of not higher than 1.0 as the third material layer. As the materials that can concurrently satisfy the refractive index and the resistance value include gold (Au), silver (Ag), copper (Cu) and so on, and gold is particularly preferable for the third material layer in view of the problems of oxidation and so on. The refractive index of gold with respect to the light in the 780-nm band is about 0.16, which is sufficiently smaller than 1.0.

It is, of course, possible to consider an approach to prevent the distribution of the emission laser light from leaking on the upper electrode side by using a material of which the refractive index is not higher than one with respect to the emission laser light for the lowermost layer of the upper electrode (p-side electrode 114). However, it is sometimes the case where a reduction in efficiency attributed to a reduction in reliability due to the adhesion and the diffusion of the material as well as an increase in scattering occur, and this is unfavorable.

The Second Embodiment

The semiconductor laser device of the second embodiment of the present invention will be described next.

As shown in FIG. 2B, the semiconductor laser device has the same structure as that of the semiconductor laser device of the first embodiment except that the structure of the upper electrode differs from the structure described in connection with the first embodiment referring to FIG. 2A. Therefore, only the points different from those of the first embodiment will be described with reference to FIGS. 1 and 3A through 3D.

As shown in FIG. 1, a p-side electrode 114' as an upper electrode is constructed of a multilayer metal thin film formed by successively layering Au/Ti/Pt/Au in a style in which the top portion and side surface portions of the ridge portion 130 and the upper surface of the second upper cladding layer 109 (portions corresponding to the sides of the ridge portion 130 except for the portion right under the ridge portion 130) are continuously covered. In FIG. 2B of an enlarged schematic view of the neighborhood of the ridge portion 130, the p-side electrode 114' is constructed of a lowermost layer 114'A made of Au put in contact with the semiconductor and an upper layer electrode constructed of Ti/Pt/Au formed on the layer. In the upper layer electrode, Ti constitutes an adhesion improvement layer 114'B, Pt constitutes a diffusion prevention layer 114'C, and Au constitutes a low-resistance layer 114'D.

The manufacturing method of the semiconductor laser device of the second embodiment will be described with reference to FIGS. 3A through 3D regarding only the points different from the manufacturing method of the semiconductor laser device of the first embodiment.

The processes of FIGS. 3A and 3B are the same as those described in the foregoing paragraphs [0106] through [0110]

of the first embodiment. In FIG. 3C, a metal thin film constructed of Au (thickness: 50 nm) as the lowermost layer of the upper electrode, Ti (thickness: 50 nm) as the adhesion improvement layer of part of the upper layer electrode, Pt (thickness: 50 nm) as the diffusion prevention layer and Au (thickness: 400 nm) as the low-resistance layer are successively layered by the electron beam evaporation method, forming a p-side electrode (upper electrode) 114'.

Subsequently, the n-GaAs substrate 101 is abraded from the back surface side to the desired thickness (about 100 μm in this case) by the lapping method, and an n-side electrode 116 (shown in FIG. 1) is formed by layering an AuGe alloy (Au: 88%, Ge: 12%) to a thickness of 100 nm and subsequently layering Ni (thickness: 15 nm) and Au (thickness: 300 nm) from the back surface side by using the thermal evaporation method.

Subsequently, an alloying process for the p-side electrode 114' and the n-side electrode 116' is carried out by heating at a temperature of 400° C. for one minute in an $N_2$ or $H_2$ atmosphere. As a result, as shown in FIG. 3D, a compound layer 115', in which Au and each semiconductor layer material are alloyed, is formed at the interface between the p-side electrode 114' and each semiconductor layer put in contact with the p-side electrode 114'.

Subsequently, by dividing the substrate 101 into bars of the desired resonator length similarly to the description of the paragraphs [0112] and [0113], carrying out end surface coating and further dividing each bar into chips, the semiconductor laser device of the second embodiment is completed.

FIG. 3F shows the relation between the metal material for the lowermost layer of the upper electrode used in the present invention and the refractive index. In FIG. 3F, the horizontal axis represents the wavelength (nm), and the vertical axis represents the refractive index. Moreover, Ti that has been used for the lowermost layer in the prior art example and used as the adhesion improvement layer in the first embodiment as well as Pt that has been used for the diffusion prevention layer are additionally shown for reference. As described above, the lowermost layer of the upper electrode is made of Au in the first embodiment. The refractive index of Au with respect to the light in the 780-nm band is about 0.16, which is smaller than 1.0 as is apparent from FIG. 3F.

On the other hand, in the semiconductor laser device of the second embodiment, the effective refractive index in the vertical direction outside the ridge portion 130 is 3.354. The value is very general in the structure of the semiconductor laser device of the kind and normally about 3.0 to 3.5. Therefore, the refractive index of Au of the lowermost layer of the upper electrode is sufficiently small with respect to the effective refractive index in the vertical direction outside the ridge portion 130 as described above.

As described above, according to the semiconductor laser device and the manufacturing method therefor, by using a material of which the refractive index with respect to the emission laser light in the 780-nm band is smaller than 1.0, the lowermost layer of the upper electrode has a value sufficiently small with respect to the effective refractive index in the vertical direction outside the ridge portion. Therefore, the emission laser light was strongly confined in the semiconductor layer, and the configuration of the light distribution was not pulled to the ridge portion side (upper electrode side). As a result, it was made possible to reduce the internal loss attributed to the photoabsorption of the upper electrode material.

Figure 3G:
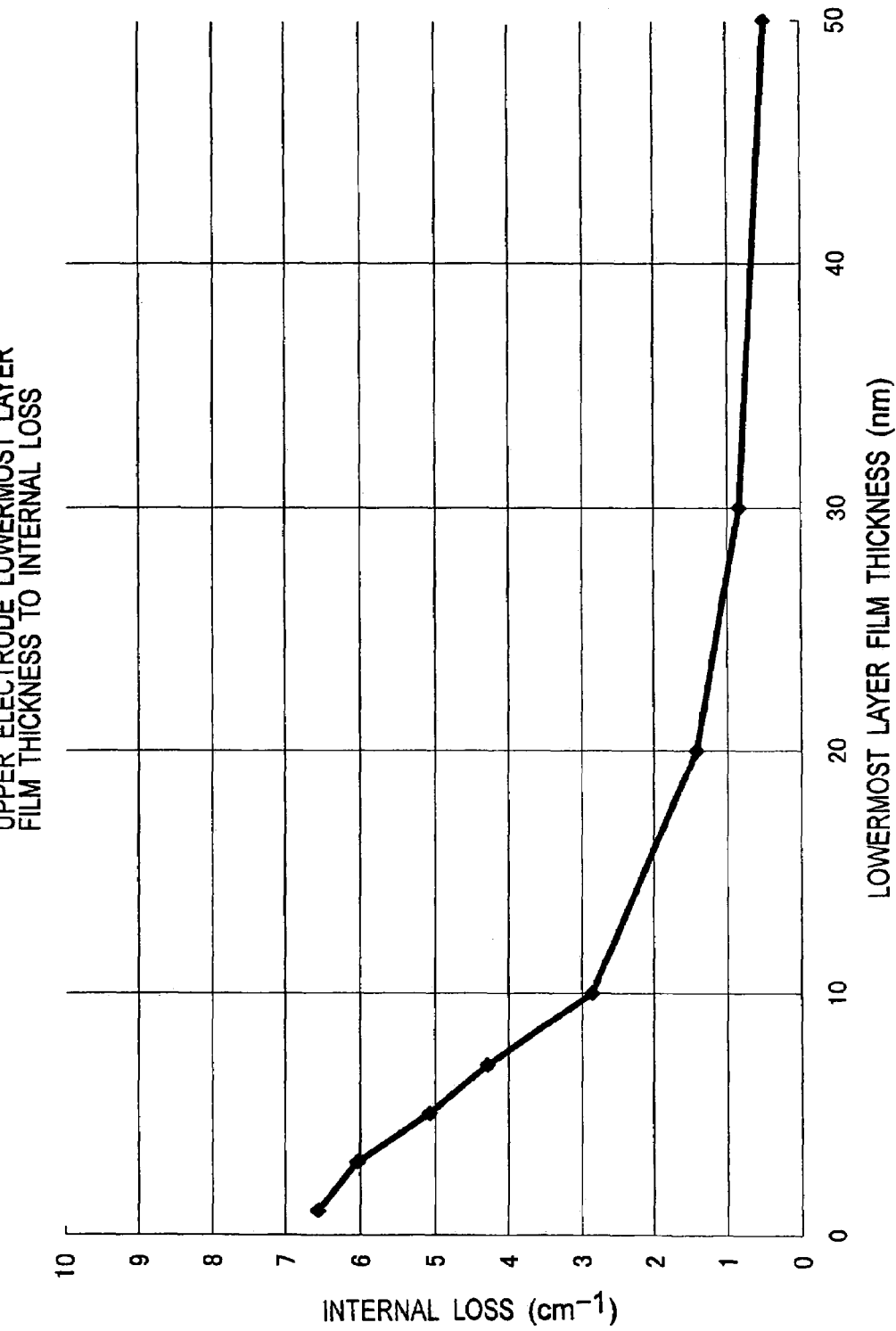
FIG. 3G is a graph showing the relation between the thickness of a lowermost layer of an upper electrode and internal loss.

FIG. 3G shows by simulation the relation between the film thickness of the lowermost layer and the internal loss in the fundamental mode when the upper layer electrode (Ti/Pt/Au) is provided as the upper electrode on the lowermost layer (Au). According to FIG. 3G, if the film thickness of the lowermost layer of the upper electrode is at least not smaller than 30 nm, then the internal loss can be made not greater than 1 $cm^{-1}$, so that the influence of the refractive index of the upper layer electrode formed on the lowermost layer can be eliminated. That is, by setting the film thickness of the lowermost layer to 30 nm or more, the construction of the upper layer electrode portion can be freely changed so as to satisfy the low resistance required for the electrode and the requirements relevant to high reliability.

Moreover, as is apparent from FIG. 3F, there are Ag, Au, Cu and Al as a material that has a region where the refractive index becomes equal to or smaller than 1.0 with respect to light of a wavelength of 400 nm to 1550 nm. It is proper to select any one of the four materials of which the refractive index can be made not greater than 1.0 with respect to the desired emission wavelength referring to FIG. 3F.

Among Ag, Au, Cu and Al, it is sometimes the case where Au is rapidly diffused in a spike form into GaAs due to heat treatment and electrification after being formed on GaAs, possibly reducing the reliability and the oscillation efficiency. In the second embodiment, such a diffusion phenomenon is restrained by catalytically using nickel (Ni) at the interface between GaAs and Au (not shown).

It is preferable to further form three layers of an adhesion improvement layer for improving the adhesion to the material to the lowermost layer, a diffusion prevention layer for preventing the diffusion of the upper layer material to the lower layer side and a low-resistance layer for reducing the wiring resistance and the contact resistance as the upper layer electrode on Au (or Ag or Cu or Al) that becomes the lowermost layer of the upper electrode. With this arrangement, the absorption of the emission laser light by the electrode is eliminated. Therefore, the upper electrode, which has a decreased internal loss, a low electrode resistance because of the upper layer electrode provided on the lowermost layer and excellent reliability capable of retaining the electrode state of the low-resistance value stably maintained even in operation, can be obtained. When the surface of the lowermost layer of the upper electrode is not exposed to the atmosphere and the upper layer electrode is continuously formed in a clean atmosphere, the adhesion improvement layer is not always necessary. For the adhesion improvement layer, Cr, Mo or the like can be used other than Ti used in the first embodiment. Moreover, Pt is preferable for the diffusion prevention layer that prevents the diffusion of Au used as the low-resistance layer as described in connection with the first embodiment. Moreover, Cu, Ag, Al or the like beside Au also exhibits a satisfactory conductivity as the low-resistance layer. However, the metal materials except for Au are easily oxidized, and therefore, the metal materials are sometimes not preferable for the low-resistance layer that becomes the outermost surface of the electrode.

As described above, in the semiconductor laser devices of the first and second embodiments, neither the current blocking layer nor the insulator for effecting current constriction is formed at the interface between the upper electrode (p-side electrode 114) and the semiconductor layer group of the second conductive type. In the region except for the uppermost portion of the ridge portion, the current constriction is effected by forming the Schottky junction at the interface between the electrode and the semiconductor layer. The p-side electrode 114 constructed of Ti/Pt/Au of the first embodiment and the p-side electrode 114' constructed of Au/Ti/Pt/Au of the second embodiment are alloyed with the respective GaAs based semiconductor materials by carrying out heat treatment at a temperature of 350 to 430° C. and a temperature of 350 to 450° C., respectively, to form the compound layers 115 and 115'. The compound layers 115 and 115' form a satisfactory ohmic junction or a stable Schottky junction to the p-type semiconductor layer depending on the doping concentration of the p-type semiconductor layer. Taking advantage of the fact, the semiconductor laser device of the first embodiment forms, in the mesa stripe portion 118a (shown in FIG. 1), the compound layer 115 of Ti or Pt and heavily doped GaAs exerting a satisfactory ohmic junction at the interface between the $p^+$-GaAs contact layer 113 having a doping concentration of not lower than $1\times10^{18}$ cm$^{-3}$ as the heavily doped semiconductor layer and the p-side electrode 114, while in the region 118b (shown in FIG. 1) other than the mesa stripe portion, the compound layer 115 of Ti or Pt and lightly doped AlGaAs exerting a stable Schottky junction at the interface between the p-$Al_{0.4885}Ga_{0.5115}$As second upper cladding layer 109 having a doping concentration of not higher than $1\times10^{17}$ cm$^{-3}$ as the lightly doped semiconductor layer and the p-side electrode 114. Also, the semiconductor laser device of the second embodiment forms, in the mesa stripe portion 118a, the compound layer 115' of Au and heavily doped GaAs exerting a satisfactory ohmic junction, while in the region 118b other than the mesa stripe portion, the compound layer 115 of Au and lightly doped AlGaAs exerting a stable Schottky junction. A satisfactory ohmic junction cannot be obtained by heat treatment at a temperature range other than that described above, and the Schottky junction property is also deteriorated. A heat treatment process is additionally carried out for one minute at a temperature of 390° C. in the first embodiment and at a temperature of 400° C. in the second embodiment according to the optimum conditions of the alloying process of AuGe/Ni/Au of the n-side electrode.

In the semiconductor laser device of the first embodiment, Ti of the first material layer 114A has a small thickness of 5 nm, and therefore, a compound layer that contains not only Ti but also Pt is formed at the interface with the semiconductor layer after the heat treatment process. However, the compound layer containing Pt is diffused to a certain depth (generally estimated to about two times the thickness of Pt at maximum) depending on the thickness of Pt and thereafter becomes stable as a consequence of the stop of diffusion. In addition, both Pt and the compound layer containing Pt as the second material layer 114B prevent the diffusion of Au of the third material layer 114C, and therefore, Au does not diffuse on the active layer 106 side beyond the second material layer 114B and the compound layer 115. Therefore, a reduction in efficiency attributed to a reduction in reliability due to the deep diffusion of Au into the semiconductor layer and an increase in scattering can be prevented.

Furthermore, the semiconductor laser devices of the first and second embodiments are successful in restraining an increase in the device resistance more than necessary by providing the first upper cladding layer 108 of a doping concentration higher than that of the second upper cladding layer 109 between the second upper cladding layer 109 and the multiple strained quantum well active layer 106 and optimizing the layer thicknesses of the first upper cladding layer 108 and the second upper cladding layer 109. The layer thickness of the second upper cladding layer 109 is set so as to become greater than the thickness of the compound layer 115. In the present invention, the compound layers 115 and 115' of the first and second embodiments have thicknesses of 1 nm and 50 nm, respectively, with respect to the layer thickness of 0.1 μm of the second upper cladding layer 109. In order to effect sufficient current constriction, a semiconductor layer that has a doping concentration of not higher than $1\times10^{17}$ cm$^{-3}$ is needed right under the compound layer 115. It is not preferable that the layer of a low doping concentration exists thick right under the ridge portion 130 in consideration of the device resistance, and therefore, the compound layer 115 should be not so thick. According to the examinations conducted by the present inventor and others, the semiconductor layer that has the doping concentration of not higher than $1\times10^{17}$ cm$^{-3}$ should preferably have a thickness of not greater than about 0.3 μm at maximum. Moreover, the compound layer 115 is only required to have a thickness of 0.2 μm at maximum, and if the thickness is greater than the value, the influence of the increase in the device resistance due to the increase in the thickness of the semiconductor layer that has the doping concentration of not higher than $1\times10^{17}$ cm$^{-3}$ becomes disadvantageously increased.

As a result, the semiconductor laser devices of the first and second embodiments achieved satisfactory device resistance without carrying out the crystal regrowth process of the electrode contact layer and allowed sufficient current constriction to be effected without adding the embedding regrowth process of the current blocking layer.

Moreover, the semiconductor laser devices of the first and second embodiments have a great degree of freedom of the optical design. The degree of freedom of the optical design is ascribed to the multiple division of the cladding layer formed on the upper side of the active layer 106 into the second upper cladding layer 109 that takes charge of the current constriction mainly by the Schottky junction and the first upper cladding layer 108 as the semiconductor layer of the second conductive type mainly assigned for the adjustment of the optical characteristics. By setting the doping concentration of the second upper cladding layer 109 that takes charge of the current constriction mainly by the Schottky junction to a concentration of not higher than $1\times10^{17}$ cm$^{-3}$ and setting the thickness to a film thickness as thin as possible within a range in which the thickness is thicker than that of the compound layer 115 or 115', the increase in the device resistance due to the addition of the layer of the doping concentration of not greater than $1\times10^{17}$ cm$^{-3}$ is restrained to a necessary minimum.

With the above arrangement, the first upper cladding layer 108 was allowed to change the layer thickness, composition and so on according to the required optical characteristic specification without any limitation taken in consideration of the Schottky junction. Therefore, the degree of freedom of the optical design was largely increased.

Although the wavelength of the emission laser light was set to 780 nm in the semiconductor laser devices of the first and second embodiments, the present invention is not limited to this. For example, the present invention can be applied also to an InGaAlP/GaAs based semiconductor laser device of the 650-nm wavelength band used for DVD's and an InGaN/GaN based semiconductor laser device of the 405-nm wavelength band. In the above case, it is proper to select the optimum metal material for the lowermost layer of the upper electrode (p-side electrode 114) referring to FIGS. 3E and 3F.

Moreover, it is acceptable to provide a semiconductor layer of the kind of an intermediate layer that is not specified in the first and second embodiments at an interface between the semiconductor layers of different material systems. Although the wet etching method was used in forming the ridge portion in the first and second embodiments, it is, of course, acceptable to use the dry etching method. Furthermore, it is also acceptable to form the ridge portion by combining the dry etching with the wet etching.

Moreover, although the p-side electrode 114 as the upper electrode has a laminate structure of the first material layer 114A that functions as the adhesion improvement layer of the high refractive index layer, the second material layer 114B that functions as the diffusion prevention layer of the high refractive index layer and the third material layer 114C of the low refractive index layer in the first embodiment, the high refractive index layer may function as at least one of the adhesion improvement layer and the diffusion prevention layer. Moreover, the upper electrode is only required to have a high refractive index layer of which the refractive index is not lower than 2.5 and the total thickness is not greater than 75 nm and a low refractive index layer of which the refractive index is not higher than 1.0 in this order from the side put in contact with the surface of the semiconductor layer group of the second conductive type.

Moreover, the satisfactory ohmic junction has been formed at the interface between the p+-GaAs contact layer 113 and the p-side electrode 114, and the Schottky junction has been formed at the interface between the p-AlGaAs second upper cladding layer 109 and the p-side electrode 114 in the first and second embodiments. However, the Schottky junction is only required to be formed between the upper electrode and at least one of the side surface of the ridge portion or the surface located in the neighborhood of the ridge portion in the region of the semiconductor layer group of the second conductive type except for the ridge portion or between the upper electrode and at least part of the region other than the uppermost portion of the ridge portion.

The Third Embodiment

Figure 4:
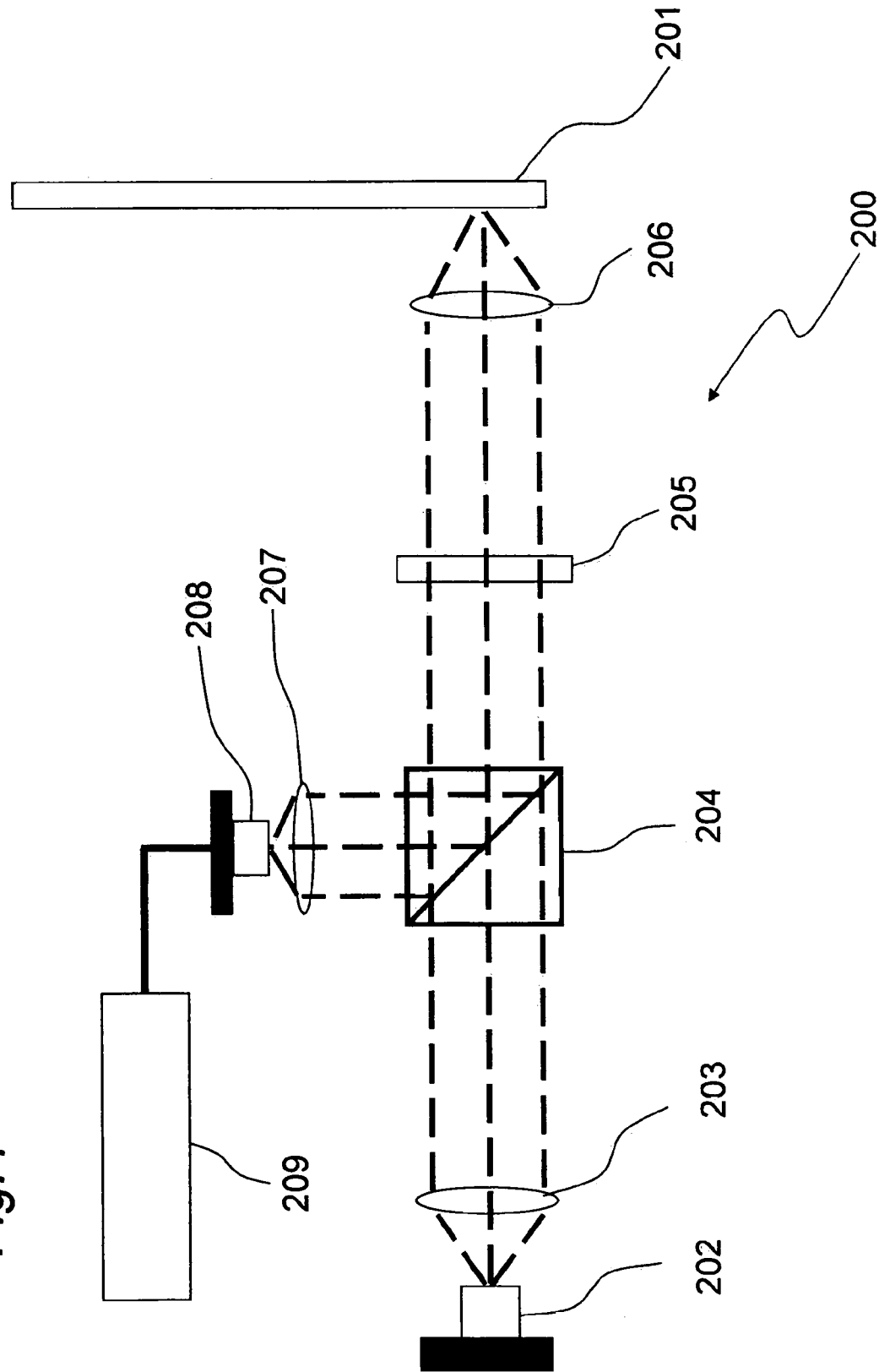
FIG. 4 is a schematic view for explaining an optical disk apparatus according to a third embodiment of the present invention.

FIG. 4 shows the structure of the optical disk apparatus 200 of the third embodiment of the present invention. The present optical disk apparatus 200 is used for writing data in an optical disk 201 and reproducing the written data and is provided with a semiconductor laser device 202 of the first embodiment of the present invention described hereinabove as a light emitting device used when writing and reproducing the data.

The optical disk apparatus 200 will be described more in detail. During write, a signal light emitted from the semiconductor laser device 202 is formed into a parallel light by a collimating lens 203, put through a beam splitter 204, adjusted in the polarization state by a λ/4 polarizer 205, collected by an object lens 206 and applied to the optical disk 201. During read, laser light that carries no data signal is applied to the optical disk 201 through the same path as the path in the write stage. The laser light is reflected on the surface of the optical disk 201 where data are recorded, put through the object lens 206 for laser light application and the λ/4 polarizer 205, thereafter reflected by the beam splitter 204 to have the angle changed by 90 degrees, collected by an photodetection object lens 207 and made incident on a signal detection photodetector 208. Then, the data signal recorded is converted into an electrical signal according to the intensity magnitude of the incident laser light in the signal detection photodetector 208 and then reproduced into the original signal in a signal light reproduction circuit 209.

The optical disk apparatus of the third embodiment employs the semiconductor laser device that has capabilities of low threshold current oscillation and high efficiency operation with the internal loss reduced further than in the conventional case and is able to be manufactured at low cost, and therefore, an optical disk apparatus capable of operating with low power consumption can be provided at a low price.

Although the examples in which the semiconductor laser device 202 of the first and second embodiments is applied to the optical disk apparatus of the recording and reproduction type has been herein described, it is needless to say that the device can be applied also to an optical disk reproduction apparatus and an optical disk recording apparatus that use the same 780-nm wavelength band and an optical disk apparatuses of the other wavelength bands (e.g., 650-nm band).

The Fourth Embodiment

Figure 5A:
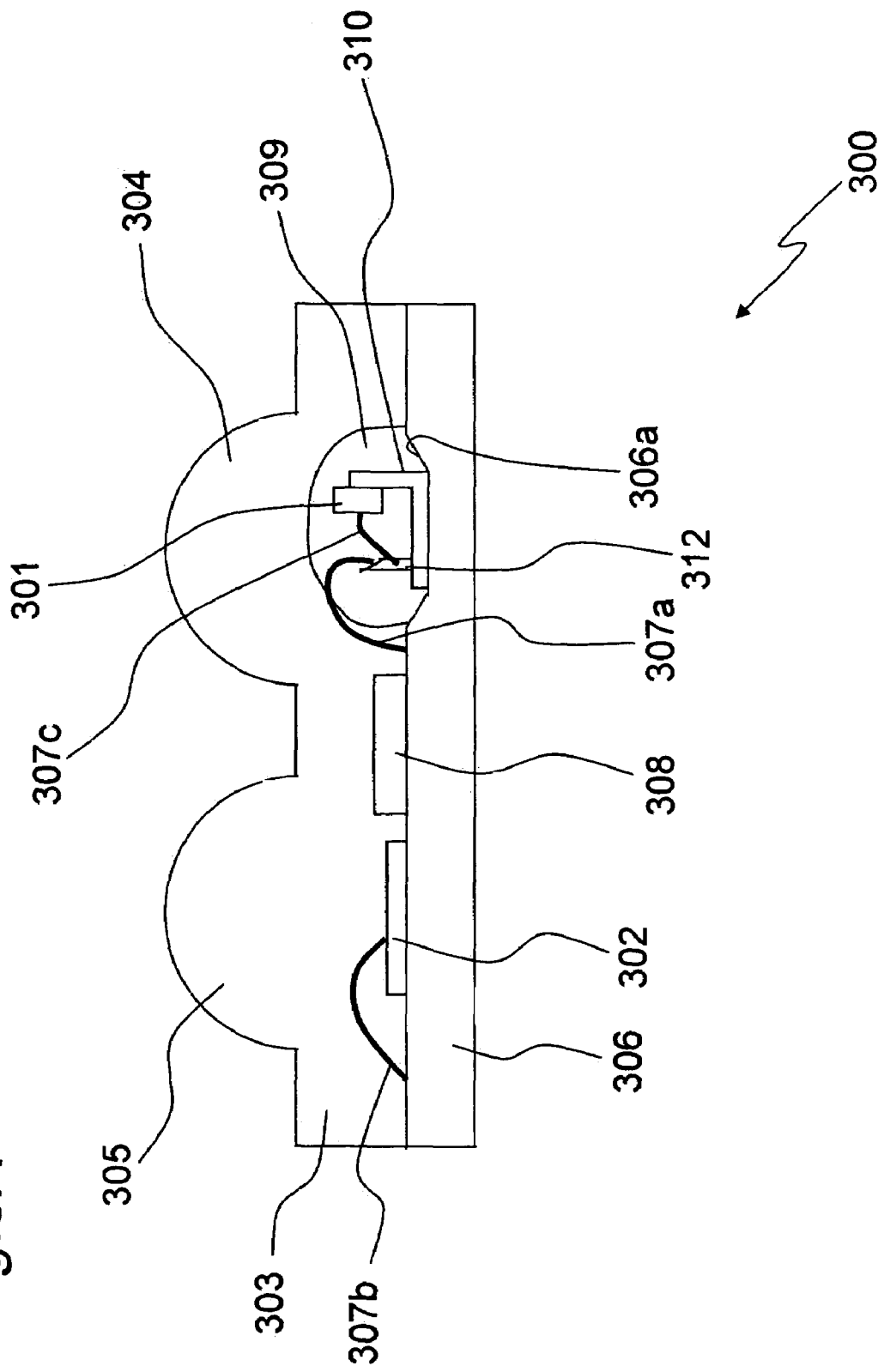
FIG. 5A is a schematic view for explaining an optical transmission module according to a fourth embodiment of the present invention.
Figure 5B:
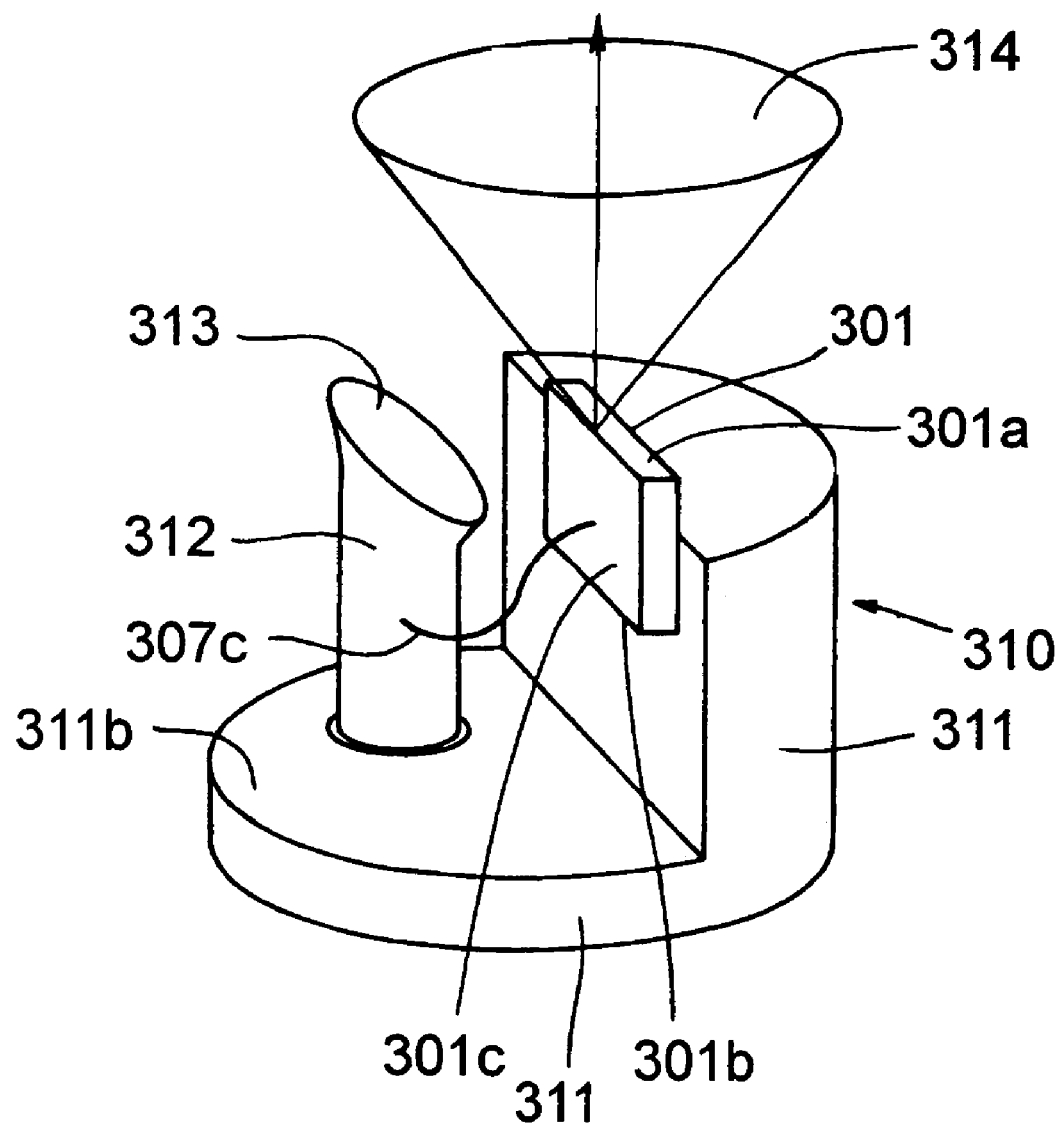
FIG. 5B is a schematic view for explaining the optical transmission module.

FIG. 5A is a sectional view showing an optical transmission module 300 used for the optical transmission system of the fourth embodiment of the present invention. FIG. 5B is an enlarged perspective view of a light source portion in the optical transmission module 300. In the fourth embodiment, an InGaAs based semiconductor laser device (laser chip 301) of an emission wavelength of 890 nm employing the construction and the manufacturing method described in connection with the first embodiment is employed as a light source, and a silicon (Si) pin photodiode is employed as a photodetector 302. By providing same optical transmission modules 300 on both party sides (for example, a terminal and a server) between which communications are exchanged, an optical transmission system for transmitting and receiving optical signals between the optical transmission modules 300 of both the parties is constituted, and the detail will be described later.

In FIG. 5A, positive and negative electrode patterns for driving the semiconductor laser device is formed on a circuit board 306, and a recess portion 306a of a depth of 300 μm is provided in the portion where the laser chip is mounted as illustrated. A laser mount 310 on which the laser chip 301 is mounted is fixed to the recess portion 306a with solder. A flat portion 313 (shown in FIG. 5B) of the positive electrode 312 of the laser mount 310 is electrically connected to a laser driving positive electrode portion (not shown) on the circuit board 306 via a wire 307a. The recess portion 306a has a depth to the extent that the radiation of the laser light is not disturbed, and surface roughness is configured so as not to influence the angle of radiation.

The photodetector 302 is also mounted on the circuit board 306, and an electrical signal is taken out via a wire 307b. Beside them, an integrate circuit (IC) 308 for laser driving/ receiving signal processing is mounted on the circuit board 306.

Next, a liquefied silicon resin 309 is dropped by a proper quantity to the recess portion 306a in which the laser mount 310 is fixed with solder. A filler for diffusing light is mixed in the silicon resin 309. The silicon resin 309 stays in the recess portion due to surface tension and is fixed to the recess portion 306a covering the laser mount 310. Although the laser mount 310 is mounted on the recess portion 306a provided on the circuit board 306 in the third embodiment, the recess portion 306a is not always required to be provided since the silicon resin 309 stays on the surface of the laser chip 301 and its neighborhood due to surface tension as described above.

Subsequently, heating is carried out at a temperature of 80° C. for about five minutes, hardening the silicon resin 309 until the resin is put into a jelly form. Next, the device is covered with a transparent epoxy resin mold 303. A lens portion 304 for controlling the angle of radiation is formed above the laser chip 301, and a lens portion 305 for collecting the signal light is formed above the photodetector 302, into an integrated mold lens.

Next, the laser mount 310 will be described with reference to FIG. 5B. As shown in FIG. 5B, the laser chip 301 is die-bonded to an L-figured heat sink 311 by using an indium (In) paste material or the like. The laser chip 301 is an InGaAs based semiconductor laser device of the construction described in connection with the first embodiment. A laser chip lower surface 301b is coated with a high reflectance film, and, on the other hand, a laser chip upper surface 301a is coated with a low reflectance film. These reflection films concurrently serve as protections of the laser chip end surfaces.

The positive electrode 312 is fastened to a base portion 311b of the heat sink 311 via an insulator so that the electrode has no electrical continuity to the heat sink 311. The positive electrode 312 and a p-electrode 301c on the surface of the laser chip 301 are connected with each other via a gold wire 307c. As described above, the laser mount 310 is fixed to a negative electrode (not shown) of the circuit board 306 of FIG. 5A with solder, and a flat portion 313 in the upper portion of the positive electrode 312 is connected to a positive electrode portion (not shown) of the circuit board 306 via the wire 307a. With the wiring thus formed, the optical transmission module 300 capable of obtaining a laser beam 314 by oscillation is completed.

The optical transmission module 300 of the fourth embodiment, which employs the semiconductor laser device of the one-time growth type that can be manufactured at low cost, is therefore able to more largely suppress the module unit price than in the conventional case. Moreover, since the semiconductor laser device capable of operating with high efficiency and a low threshold current is employed, the power consumption of the optical transmission module 300 can be reduced.

As described above, by providing the same optical transmission modules 300 on both sides of the parties between which communications are exchanged, the optical transmission system for transmitting and receiving the optical signals between the optical transmission modules 300 of both parties is constituted.

Figure 6:
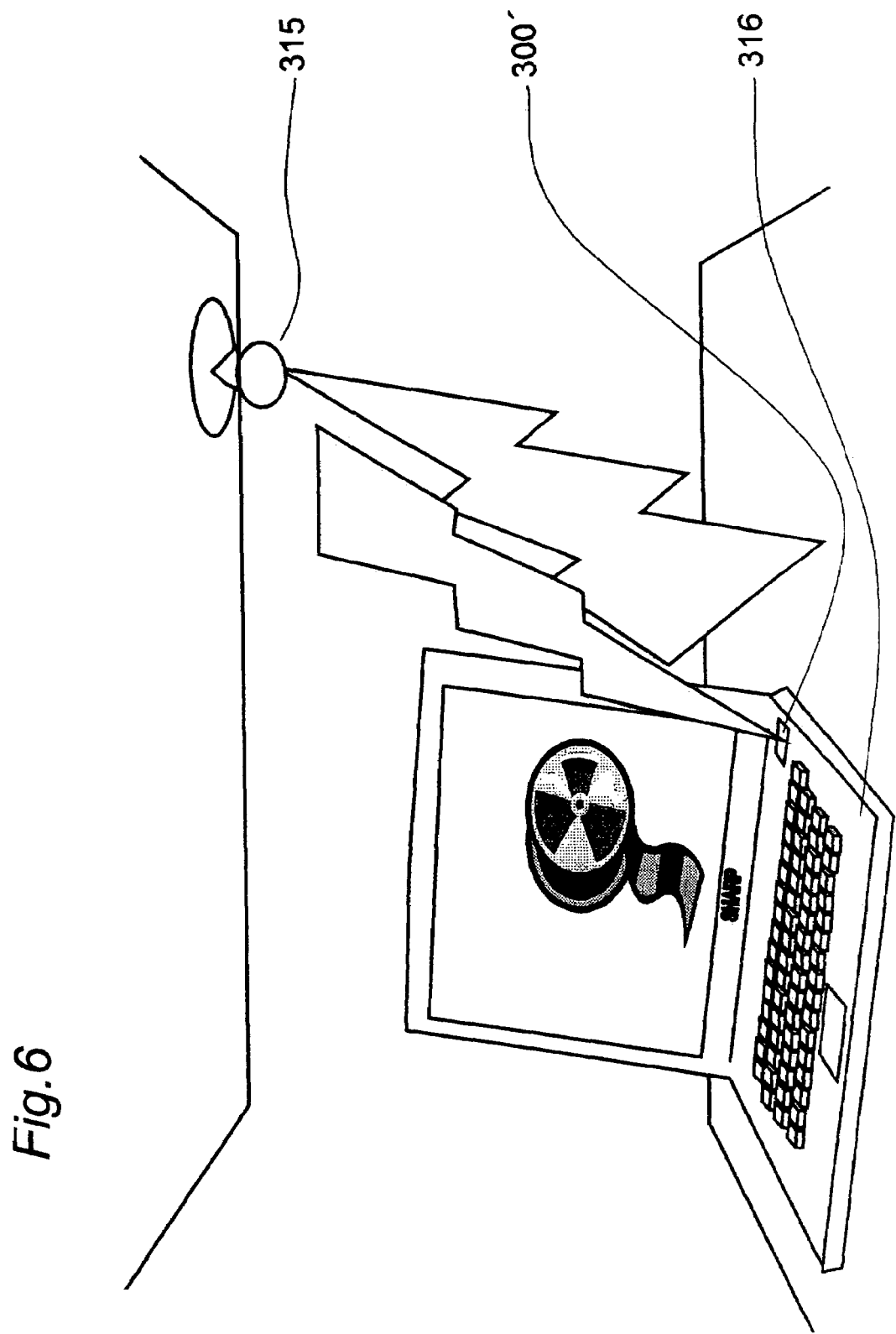
FIG. 6 is a schematic view for explaining the optical transmission system that employs the above optical transmission module.
Figure 7:
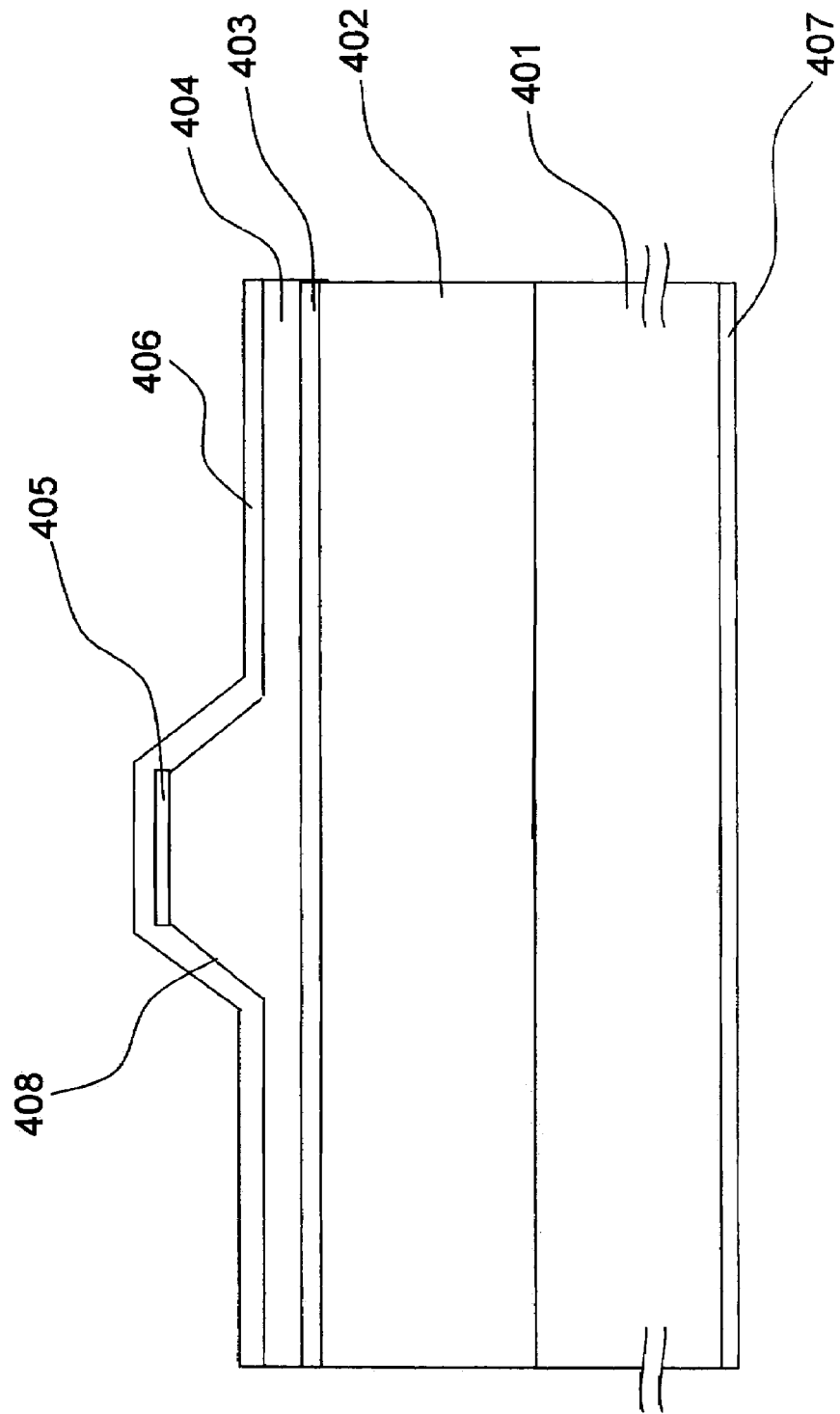
FIG. 7 is a schematic sectional view for explaining a conventional semiconductor laser device.

FIG. 6 shows an example of the construction of the optical transmission system that employs the optical transmission modules 300. The optical transmission system includes the optical transmission module 300 provided for the base station 315 installed on the ceiling of a room, while the same optical transmission module (indicated by a reference numeral 300' for distinction) is provided for a personal computer 316. An optical signal, which is emitted from the light source of the optical transmission module 300' on the personal computer 316 side with information is received by the photodetector of the optical transmission module 300 on the base station 315 side. An optical signal emitted from the optical transmission module 300 on the base station 315 side is received by the photodetector of the optical transmission module 300' on the personal computer 316 side. As described above, data communications by light (infrared rays) can be achieved.

The optical transmission module 300 of the fourth embodiment, which employs the semiconductor laser device that can be manufactured less expensively and has an internal loss further reduced than in the conventional case as described hereinabove, is therefore able to provide an optical transmission system of low power consumption at a low price. When the present optical transmission system is mounted on portable equipment, the continuous operation time can be extended further than in the case where the conventional light emitting device is mounted by virtue of the small power consumption, making it possible to constitute a more convenient portable optical transmission system at a low price.

It is a matter of course that the semiconductor laser device, the optical disk apparatus and the optical transmission system of the present invention are not limited to the above embodiments, and, for example, the layer thickness and the number of layers of the well layer and the barrier layer that constitute the multiple strained quantum well active layer 106 and so on can be subject to various modifications so long as they do not depart from the scope of the present invention.

What is claimed is:

1. A ridge waveguide semiconductor laser device having at least an active layer and a semiconductor layer group of a second conductive type on which a ridge portion is formed on a substrate of a first conductive type, comprising:

an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion, the upper electrode having a high refractive index layer and a low refractive index layer formed successively from a side put in contact with the semiconductor layer group of the second conductive type the high refractive index layer having a refractive index of not lower than 2.5 with respect to a wavelength band of emission laser light and a thickness of not greater than 75 nm, and the low refractive index layer having a refractive index of not higher than 1.0.

2. The semiconductor laser device as claimed in claim 1, wherein
the thickness of the high refractive index layer is not greater than 15 nm.

3. The semiconductor laser device as claimed in claim 1, wherein
the high refractive index layer functions as at least one of an adhesion improvement layer and a diffusion prevention layer.

4. The semiconductor laser device as claimed in claim 3, wherein
the adhesion improvement layer is made of at least one of titanium, chromium and molybdenum.

5. The semiconductor laser device as claimed in claim 3, wherein
the diffusion prevention layer is made of at least one of platinum group elements.

6. The semiconductor laser device as claimed in claim 3, wherein
the upper electrode comprises at least a first material layer that is the high refractive index layer and functions as the adhesion improvement layer, a second material layer that is the high refractive index layer and functions as the diffusion prevention layer and a third material layer that is the low refractive index layer of a refractive index of not higher than 1.0, the layers being formed successively from a side of the semiconductor layer group of the second conductive type.

7. The semiconductor laser device as claimed in claim 6, wherein
the first material layer has a thickness of not smaller than 1 nm and not greater than 25 nm, the second material layer has a thickness of not smaller than 5 nm and not greater than 50 nm, and a total thickness of the first material layer and the second material layer is not greater than 75 nm.

8. The semiconductor laser device as claimed in claim 7, wherein
a compound layer, which is comprised of at least one constituent element of titanium, chromium, molybdenum and a platinum group element and a constituent element of the semiconductor layer group of the second conductive type, is formed at an interface between the first material layer of the upper electrode and the semiconductor layer group of the second conductive type.

9. The semiconductor laser device as claimed in claim 1, wherein
an ohmic junction is formed of the upper electrode and an uppermost portion of the ridge portion, and a Schottky junction is formed of the upper electrode and at least one of the side surface of the ridge portion and a surface of the semiconductor layer group of the second conductive type in a region located in the neighborhood of the ridge portion except for the ridge portion.

10. The semiconductor laser device as claimed in claim 1, wherein
the semiconductor layer group of the second conductive type has a heavily doped semiconductor layer that is provided in an uppermost portion of the ridge portion and has a doping concentration of not lower than $1\times10^{18}$ $cm^{-3}$ and a lightly doped semiconductor layer that is provided at least in a region other than the uppermost portion of the ridge portion and has a doping concentration of not higher than $1\times10^{17}$ $cm^{-3}$,
a compound layer on a heavily doped side comprised of a constituent element of the upper electrode and a constituent element of the heavily doped semiconductor layer is formed at an interface between the upper electrode and the heavily doped semiconductor layer, and
a compound layer on a lightly doped side comprised of a constituent element of the upper electrode and a constituent element of the lightly doped semiconductor layer is formed at an interface between the upper electrode and the lightly doped semiconductor layer.

11. The semiconductor laser device as claimed in claim 10, wherein
at least a semiconductor layer of the second conductive type having a doping concentration of not lower than $1\times10^{17}$ $cm^{-3}$ is formed between the lightly doped semiconductor layer and the active layer.

12. An optical disk apparatus employing the semiconductor laser device claimed in claim 1.

13. An optical transmission system employing the semiconductor laser device claimed in claim 1.

14. A semiconductor laser device manufacturing method comprising the steps of:
forming an active layer on a substrate of the first conductive type;
forming a semiconductor layer group of the second conductive type on the active layer;
forming a ridge portion by partially removing the semiconductor layer group of the second conductive type; and
forming an upper electrode on the semiconductor layer group of the second conductive type, whereby
in the step of forming the upper electrode, one or a plurality of high refractive index layers of a refractive index of not lower than 2.5 with respect to a wavelength band of emission laser light are formed so as to have a total thickness of not greater than 75 nm and a low refractive index layer of a refractive index of not higher than 1.0 is formed on the high refractive index layer.

15. The semiconductor laser device manufacturing method as claimed in claim 14, wherein
the step of forming the upper electrode comprises the step of forming a first material layer that is made of at least one of titanium, chromium and molybdenum and functions as an adhesion improvement layer and the step of forming a second material layer that is made of at least one of platinum group elements and functions as a diffusion prevention layer as high refractive index layers, and the step of forming a third material layer of a low refractive index layer of a refractive index of not higher than 1.0.

16. The semiconductor laser device manufacturing method as claimed in claim 14, wherein
the step of forming the semiconductor layer group of the second conductive type on the active layer comprises at least the step of forming a lightly doped semiconductor layer of a doping concentration of not higher than $1\times10^{17}$ $cm^3$ and a heavily doped semiconductor layer of a doping concentration of not lower than $1\times10^{18}$ $cm^{-3}$ on the active layer, and
the method comprises the step of forming a compound layer at an interface between the semiconductor layer group of the second conductive type and the upper electrode by carrying out heat treatment after the step of forming the upper electrode.

17. The semiconductor laser device manufacturing method as claimed in claim 16, wherein
the step of forming the semiconductor layer of the second conductive type comprises at least the step of forming a semiconductor layer of the second conductive type that has a doping concentration of not lower than $1\times10^{17}$ $cm^{-3}$ between the lightly doped semiconductor layer and the active layer.

18. A ridge waveguide semiconductor laser device which has at least an active layer and a semiconductor layer group of the second conductive type on a substrate of the first conductive type and in which part of an upper portion of the semiconductor layer group of the second conductive type forms a ridge portion of a stripe configuration, comprising:
an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion,
the upper electrode having at least a lowermost layer of a refractive index of not higher than 1.0 with respect to emission laser light,
wherein the lowermost layer of the upper electrode, whose refractive index with respect to the emission laser light is not higher than 1.0, has a film thickness of not smaller than 30 nm.

19. The semiconductor laser device as claimed in claim 18, wherein
the lowermost layer of the upper electrode is made of at least one of Au, Ag, Cu and Al.

20. The semiconductor laser device as claimed in claim 18, wherein
an ohmic junction is formed of the upper electrode and an uppermost portion of the ridge portion of the semiconductor layer group of the second conductive type, and a Schottky junction is formed of the upper electrode and at least part of a region other than the uppermost portion of the ridge portion.

21. An optical disk apparatus employing the semiconductor laser device claimed in claim 18.

22. An optical transmission system employing the semiconductor laser device claimed in claim 18.

23. A ridge waveguide semiconductor laser device which has at least an active layer and a semiconductor layer group of the second conductive type on a substrate of the first conductive type and in which part of an upper portion of the semiconductor layer group of the second conductive type forms a ridge portion of a stripe configuration, comprising:

an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion, the upper electrode having at least a lowermost layer of a refractive index of not higher than 1.0 with respect to emission laser light, wherein three layers of at least an adhesion improvement layer, a diffusion prevention layer and a low-resistance layer are successively layered on the lowermost layer of the upper electrode.

24. A ridge waveguide semiconductor laser device which has at least an active layer and a semiconductor layer group of the second conductive type on a substrate of the first conductive type and in which part of an upper portion of the semiconductor layer group of the second conductive type forms a ridge portion of a stripe configuration, comprising:

an upper electrode which is formed on the semiconductor layer group of the second conductive type and put in contact with at least one of a side surface of the ridge portion of the semiconductor layer group of the second conductive type and a surface located in the neighborhood of the ridge portion in a region of the semiconductor layer group of the second conductive type except for the ridge portion, the upper electrode having at least a lowermost layer of a refractive index of not higher than 1.0 with respect to emission laser light, wherein the uppermost portion of the ridge portion of the semiconductor layer group of the second conductive type is a heavily doped semiconductor layer of the second conductive type of a doping concentration of not lower than $1 \times 10^{18}$ cm$^{-3}$, at least part of the region other than the uppermost portion of the ridge portion of the semiconductor layer group of the second conductive type is a lightly doped semiconductor layer of the second conductive type of a doping concentration of not higher than $1 \times 10^{17}$ cm$^{-3}$, a compound layer on a heavily doped side comprised of a constituent element of the upper electrode and a constituent element of the heavily doped semiconductor layer is formed at an interface between the upper electrode and the heavily doped semiconductor layer, and a compound layer on a lightly doped side comprised of a material of the upper electrode and a constituent element of the lightly doped semiconductor layer is formed at an interface between the upper electrode and the lightly doped semiconductor layer.

25. The semiconductor laser device as claimed in claim 24, wherein at least a semiconductor layer of the second conductive type having a doping concentration of not lower than $1 \times 10^{17}$ cm$^{-3}$ is formed between the lightly doped semiconductor layer and the active layer.

26. A semiconductor laser device manufacturing method comprising the steps of:

forming an active layer on a substrate of the first conductive type;

forming a semiconductor layer group of the second conductive type on the active layer;

forming a ridge portion by removing part of the semiconductor layer group of the second conductive type; and forming an upper electrode by using a metal material whose refractive index with respect to emission laser light is not higher than 1.0 for a lowermost layer on the semiconductor layer group of the second conductive type, wherein the step of forming the semiconductor layer group of the second conductive type has the step of forming a heavily doped semiconductor layer of a doping concentration of not lower than $1 \times 10^{18}$ cm$^{-3}$ as an uppermost portion of the ridge portion and forming a lightly doped semiconductor layer of a doping concentration of not higher than $1 \times 10^{17}$ cm$^{-3}$ at least in a region other than the ridge portion, and the method comprises the step of forming a compound layer at an interface between the semiconductor layer group of the second conductive type and the upper electrode by carrying out heat treatment after the step of forming the upper electrode.

27. The semiconductor laser device manufacturing method as claimed in claim 26, wherein the step of forming the semiconductor layer group of the second conductive type comprises the step of forming at least a semiconductor layer of the second conductive type that has a doping concentration of not lower than $1 \times 10^{17}$ cm$^{-3}$ between the lightly doped semiconductor layer and the active layer.

\* \* \* \* \*